United States Patent
Shimizu et al.

(10) Patent No.: US 6,882,039 B2
(45) Date of Patent: Apr. 19, 2005

(54) SEMICONDUCTOR DEVICE

(75) Inventors: Hiroya Shimizu, Ryugasaki (JP); Asao Nishimura, Kokubunji (JP); Tosiho Miyamoto, Kodaira (JP); Hideki Tanaka, Sagamihara (JP); Hideo Miura, Koshigaya (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/909,402

(22) Filed: Aug. 3, 2004

(65) Prior Publication Data

US 2005/0006751 A1 Jan. 13, 2005

Related U.S. Application Data

(63) Continuation of application No. 10/212,104, filed on Aug. 6, 2002, now Pat. No. 6,784,533, which is a continuation of application No. 09/988,587, filed on Nov. 20, 2001, now Pat. No. 6,531,785, which is a continuation of application No. 09/731,757, filed on Dec. 8, 2000, now Pat. No. 6,326,699, which is a continuation of application No. 09/397,853, filed on Sep. 17, 1999, now Pat. No. 6,211,576.

(30) Foreign Application Priority Data

Sep. 18, 1998 (JP) ............................................ 10-264300

(51) Int. Cl.[7] .............................................. H01L 23/52
(52) U.S. Cl. ...................... 257/691; 257/786; 257/503; 257/734; 257/735; 257/736
(58) Field of Search ................................ 257/691, 786, 257/503, 734, 735, 736, 737

(56) References Cited

U.S. PATENT DOCUMENTS

| | | |
|---|---|---|
| 5,016,087 A | 5/1991 | Haug et al. |
| 5,270,253 A | 12/1993 | Arai et al. |
| 5,359,224 A | 10/1994 | Heinen et al. |
| 5,390,140 A | 2/1995 | Tomishima et al. |
| 5,473,198 A | 12/1995 | Hagiya et al. |
| 5,539,250 A | 7/1996 | Kitano et al. |
| 5,585,665 A | 12/1996 | Anjoh et al. |
| 5,767,583 A | 6/1998 | Lee et al. |
| 5,798,571 A | 8/1998 | Nakajima |
| 5,801,440 A | 9/1998 | Chu et al. |
| 5,804,871 A | 9/1998 | Maeda |
| 5,825,083 A | 10/1998 | Takata et al. |
| 5,952,726 A | 9/1999 | Liang |
| 5,956,567 A | 9/1999 | Tomita |
| 5,982,043 A | 11/1999 | Iwata |
| 6,091,140 A | 7/2000 | Toh et al. |
| 6,150,728 A | 11/2000 | Tsukude et al. |
| 6,175,161 B1 | 1/2001 | Goetz et al. |
| 6,211,576 B1 | 4/2001 | Shimizu et al. |
| 6,326,699 B1 | 12/2001 | Shimizu et al. |
| 6,531,339 B1 | 3/2003 | King et al. |
| 2002/0047179 A1 | 4/2002 | Shimizu et al. |
| 2003/0127712 A1 | 7/2003 | Marakami et al. |

FOREIGN PATENT DOCUMENTS

| | | |
|---|---|---|
| EP | 0-464 751 A2 | 7/1991 |
| EP | 0-573965 | 12/1993 |
| JP | 6-163822 | 6/1994 |
| JP | 8-023000 | 1/1996 |
| JP | 8-250498 | 9/1996 |
| JP | 9-064310 | 3/1997 |

*Primary Examiner*—Jasmine Clark
(74) *Attorney, Agent, or Firm*—Antonelli, Terry, Stout & Kraus, LLP

(57) ABSTRACT

A semiconductor device including a semiconductor element having external terminals at a first level and external electrodes at a second level, higher than the first level. The external terminals include power terminals, ground terminals and signal terminals formed on a main surface of the semiconductor element. The external electrodes include power electrodes connected to the power terminals via power connecting sections, ground electrodes connected to the ground terminals via ground connecting sections and signal electrodes connected to the signal terminals via signal connecting sections. One of the signal terminals, signal electrodes and corresponding signal connecting sections are surrounded by either the power connecting sections connecting the power terminals and power electrodes or by the ground connection sections connecting the ground terminals and ground electrodes.

9 Claims, 18 Drawing Sheets

SEMICONDUCTOR DEVICE

CROSS-REFERENCE TO RELATED APPLICATIONS

This application is a Continuation application of Ser. No. 10/212,104, filed Aug. 6, 2002, now U.S. Pat. No. 6,784,533 which is a Continuation application of Ser. No. 09/988,587, filed Nov. 20, 2001 (now U.S. Pat. No. 6,531,785), which is a Continuation of Ser. No. 09/731,757 filed Dec. 8, 2000 (now U.S. Pat. No. 6,326,699), which is a Continuation of Ser. No. 09/397,853 filed Sep. 17, 1999 (now U.S. Pat. No. 6,211,576), the entire disclosures of which are hereby incorporated by reference.

BACKGROUND OF THE INVENTION

The present invention relates to a semiconductor device which is structured to connect pads with bumps for outside connection by wiring sections in a semiconductor element and more particularly to the semiconductor device which may reduce the operating noise even if its clock frequency is several hundred MHz or more.

In recent days, semiconductor devices have been more and more requested to enhance its density, integration and speed and lower its cost. In order to meet with the request, for example, as disclosed in JP-A-8-250498, a semiconductor device has been designed so that wiring sections and bumps are formed on a pad forming surface of a semiconductor element and those wiring sections and bumps are conductive with the pads. As shown in FIG. 17, in such a technology, a pad forming surface of a semiconductor element is formed to have a plurality of pads, and a plurality of wiring sections are formed on the pad forming surface so that those wiring sections may make a continuity with one of those pads. The bumps are formed at predetermined positions in the wiring sections so that those bumps may be formed at any interval without being limited by the positions and the intervals of the pads merely by prescribing those predetermined positions. The outer dimension of the semiconductor device is, therefore, the substantially same as the dimension of the chip on which the semiconductor element is mounted, so that the semiconductor device may be manufactured in higher density and integration and lower cost.

In order to reduce the power noise of an LSI chip and make the operation faster, for example, as disclosed in JP-A-6-163822, a planar power wiring pattern is formed on the substantially overall surface of the chip except signal electrode pads. This technology as shown in FIG. 18 provides a capability of directly supplying an electric power from the planar power surface to a circuit element located under the planar power surface, which leads to reducing the inductance and the power noise of the LSI chip, thereby making the operation of the semiconductor device faster.

As described above, the conventional semiconductor devices may be composed in higher density and integration and lower cost by forming the pads, the bumps and the wiring sections on the pad forming surface of the semiconductor element. However, those semiconductor devices still have a problem in speed.

For example, if a semiconductor device provided with a supply voltage of 3.3 V is operated at a clock frequency of 200 MHz, roughly speaking, it is necessary to switch a signal voltage from a high state (supply voltage) to a low state (ground voltage) merely for a time of 500 ps corresponding to 10% of a clock period 5 ns. Assuming that the load capacitance at this time is about 10 pF, the charges to be charged in this capacitance may be calculated as 10 pF×3.3 V=33 pC. The current flowing in the switching is represented by differentiating the charges in time, that is, 33 pC/500 ps=0.066 A. It is known that this kind of transient current flow in switching a signal may give rise to a noise voltage by the inductance of the wiring system and thereby serves to malfunction the semiconductor device, for example, as described in E. E. Davidson et al., IBM J. Res. Dev. May 1982, vol. 26. This noise voltage may be represented by a time-base change rate of the inductance and the transient current. For example, assuming that the inductance of one lead of the semiconductor device is 10 nH, a noise voltage of about 1.3 V per lead is generated. This noise voltage may be derived by 10 nH×0.066 A/500 ps. If this kind of noise appears in the power supply, the ground or the signal line, the actual high or low state is erroneously read. This may lead to malfunction. As mentioned above, this noise is roughly in proportion to the operating speed, that is, the operating frequency. Hence, in order to reduce the operating frequency, the operation speed cannot be made faster. Hence, for making the operation speed faster, it is necessary to reduce another parameter for determining the noise, that is, the inductance of the wiring system provided in the semiconductor device.

The foregoing semiconductor device disclosed in JP-A-8-250498 may provide a smaller semiconductor device than the conventional surface mounting type semiconductor device by forming the pads, the bumps and the wiring sections on the pad forming surface. It means that the inductance of the wiring system is reduced as compared with the conventional surface mounting type semiconductor device. However, considering that a conductor having a length of several millimeters contains roughly several nH inductance, the foregoing semiconductor does not provide so low an inductance as meeting the request by the recent various systems that need to operate at a quite fast speed.

Further, the semiconductor device disclosed in JP-A-6-163822 considers reduction of the inductance on the power wiring side. However, it does not consider reduction of the inductance on the ground wiring side. Hence, the semiconductor device has no means of reducing the noise caused on the ground wiring side. Further, the pads are scattered on the chip surface and when this chip is mounted on the mounting substrate by bumps or the like, those bumps are scattered as well. It means that the planar conductive layer cannot be easily formed.

SUMMARY OF THE INVENTION

In consideration of the foregoing problem, it is an object of the present invention to provide a semiconductor device which contains a lower inductance of the wiring system for the purpose of meeting with the requests of high density and integration, low cost and the like without making the manufacturing process complicated as well as making the semiconductor device operate at a faster clock frequency than several hundreds MHz as keeping its noise low. Further, the present invention provides a capability of reducing the noises generated on the power wiring side as well as the ground wiring side. Moreover, the invention also provides the solving method for a general structure having difficulty in reducing the inductance on the wiring system because of the pads and bumps located on the chip surface.

In carrying out the foregoing object, the semiconductor device according to the invention of the present application is characterized by including the following structures:

(1) In a semiconductor device including a semiconductor element having power pads for supplying a power potential, (1) ground pads for supplying a ground potential, signal pads for inputting and outputting a signal, all of which are formed on one main surface thereof; power bumps for outside connection being connected with the power pads by power wiring sections; ground bumps for outside connection being connected with the ground pads by the ground wiring sections; and signal pads for outside connection being connected with the signal pads by signal wiring sections, the power wiring section or the ground wiring section is located adjacently on both sides of the signal wiring sections.

(2) In a semiconductor device having a plurality of pads, a plurality of bumps, and a plurality of wiring sections for connecting the pads with the bumps, all of which are formed on one main surface of the semiconductor element, the plurality of pads include power pads, ground pads and signal pads, the plurality of wiring sections include power bumps, ground bumps and signal bumps, the plurality of wiring sections include power wiring sections, ground wiring sections and signal wiring sections, and the power wiring section or the ground wiring section is formed adjacently on both sides of at least one part of the signal wiring section.

(3) In (1) or (2), the ground wiring sections and the signal wiring sections are both located on one main surface of the semiconductor element through several n-type layer.

(4) In (1) or (2), the power wiring sections and the ground wiring sections and the signal wiring sections are located on one main surface of the semiconductor element through several n-type layers.

(5) In either one of (1) to (4), each width of the power wiring section and the ground wiring section is wider than the width of the signal wiring section.

(6) In (5), the power wiring section or the ground wiring section is located in a manner to cover an outer peripheral area of one main surface of the semiconductor element.

(7) In a semiconductor device including a semiconductor element having power pads for supplying a power potential; ground pads for supplying a ground potential; and signal pads for inputting and outputting a signal, all of which are formed on one main surface thereof, power bumps for outside connection being connected with the power pads by power wiring sections, ground bumps for outside connection being connected with the ground pads by ground wiring sections, and signal bumps for outside connection being connected with the signal pads by the signal wiring sections, each width of the power wiring section and the ground wiring section is wider than the width of the signal wiring section, and the power wiring section or the ground wiring section is located in a manner to cover an outer peripheral area of one main surface of the semiconductor element.

(8) In a semiconductor device including a semiconductor element having power pads for supplying a power potential; ground pads for supplying a ground potential and signal pads for inputting and outputting a signal, all of which are formed on one main surface thereof; power bumps for outside connection being connected with the power pads by power wiring sections; ground bumps for outside connection being connected with the ground pads by ground wiring sections; and signal bumps for outside connection being connected with the signal pads by signal wiring sections, a central portion of one main surface of the semiconductor element includes a pad sequence having a repetition of a combiantion of one power pad, one ground pad and one signal pad located along one side of an outer edge portion of the semiconductor element, the one power pad being connected with at least two power bumps located on both sides of the pad sequence by means of the power wiring sections, the one ground pad being connected with at least two power bumps located on both sides of the pad sequence by the ground wiring sections, and the one signal pad being connected with the one signal pad located on either side of the pad sequence by the signal wiring sections.

(9) In a semiconductor device including a semiconductor element having power pads for supplying a power potential, ground pads for supplying a ground potential, and signal pads for inputting and outputting a signal, all of which are formed on one main surface thereof; power bumps for outside connection being connected with the power pads by power wiring sections; ground bumps for outside connection being connected with the ground pads by the ground wiring sections; and signal bumps for outside connection being connected with the signal pads by the signal wiring sections; a central portion of the one main surface of the semiconductor element includes a pad sequence having a repetition of a combiantion of one power pad, one ground pad and two or more signal pads located along one side of the outer edge of the semiconductor element, the one power pad being connected with at least two power bumps located on both sides of the pad sequence by the power wiring sections, the one ground pad being connected with at least two ground bumps located on both sides of the pad sequence by the ground wiring sections, each of the two or more signal pads being connected with the signal pads located on both sides of the pad sequence in a one-to-one manner by the signal wiring sections, and the signal wiring sections being alternately extended on both sides of the pad sequence.

(10) In (8) or (9), the power wiring sections, the ground wiring sections and the signal wiring sections are located on the one main surface of the semiconductor element through several n-type layers, and each width of the power wiring section and the ground wiring section is wider than the width of the signal wiring section.

(11) In (8) or (9), the signal pad is any combination of one or two or more of data, clock, write-enable and data-mask.

DESCRIPTIONS OF THE EMBODIMENTS

Hereafter, the embodiments of the present invention will be described with reference to the appended drawings.

Figure 1:
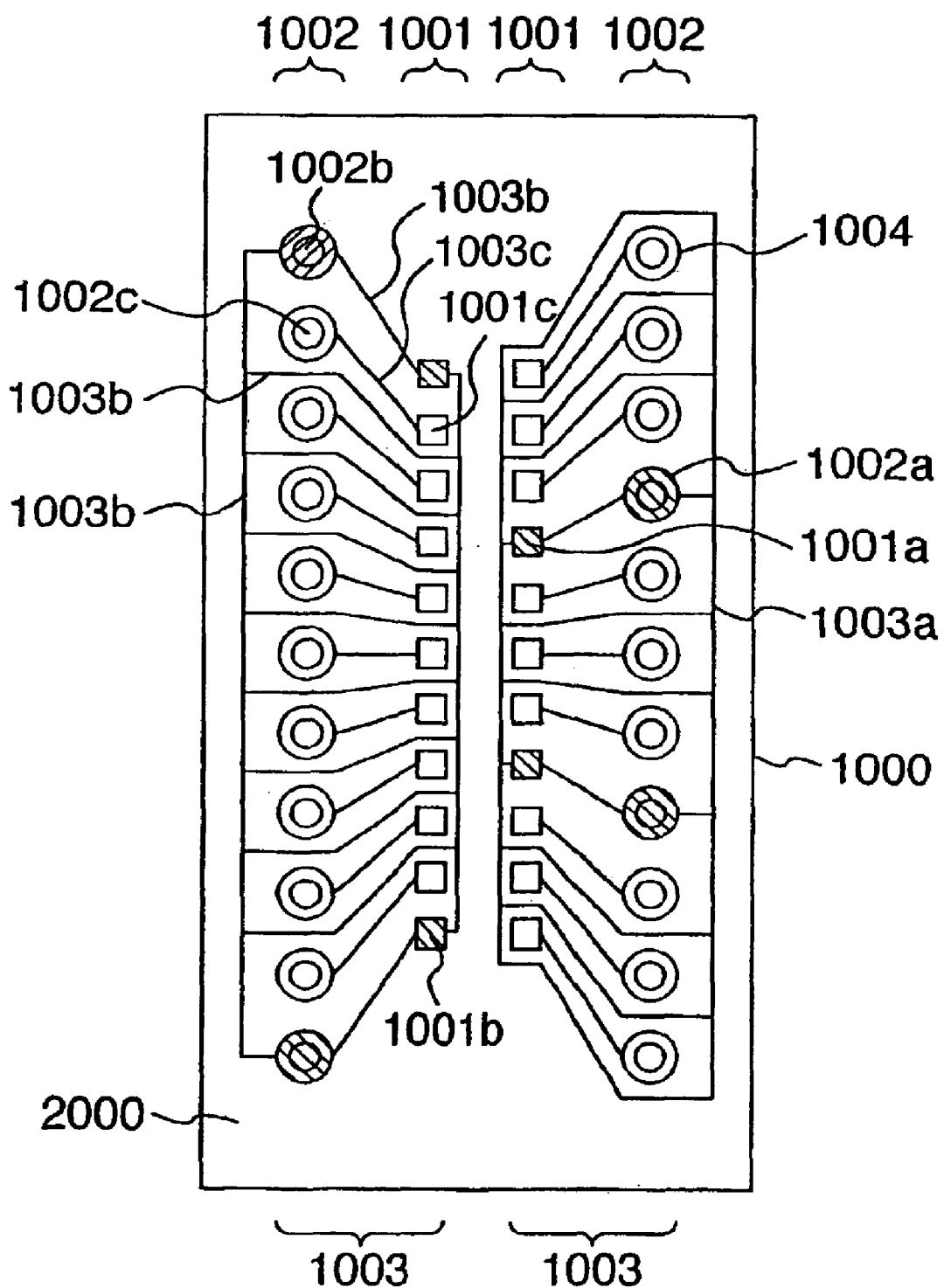
FIG. 1 is a plan view showing a wiring pattern of a semiconductor device according to an embodiment of the present invention.
Figure 2A:
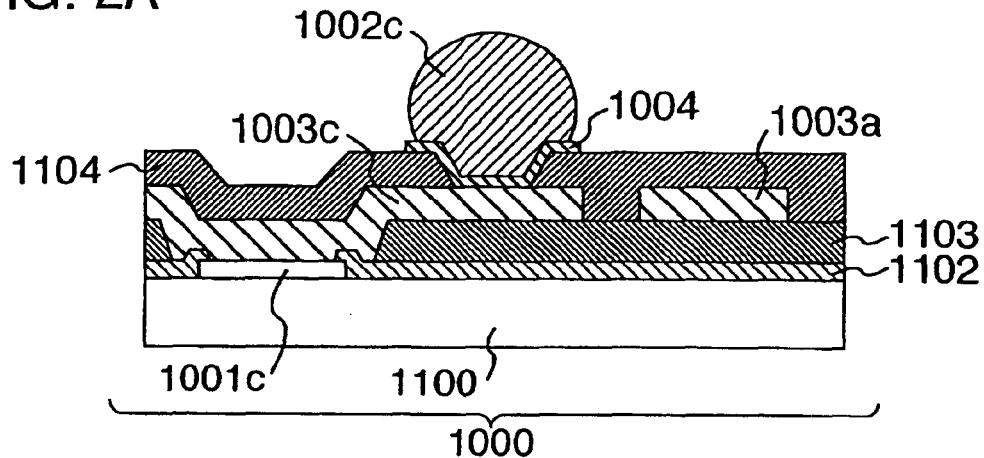
FIGS. 2A, 2B, 2C are sectional view showing a semiconductor device according to the embodiment of the present invention.
Figure 2B:
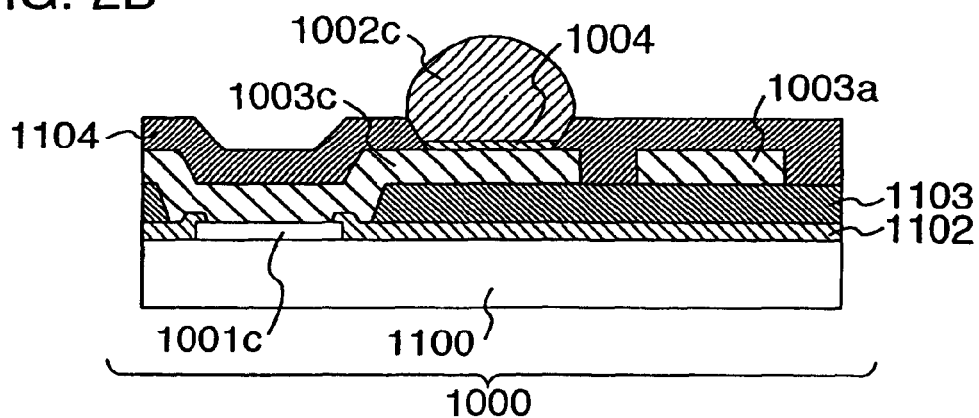
Figure 2C:
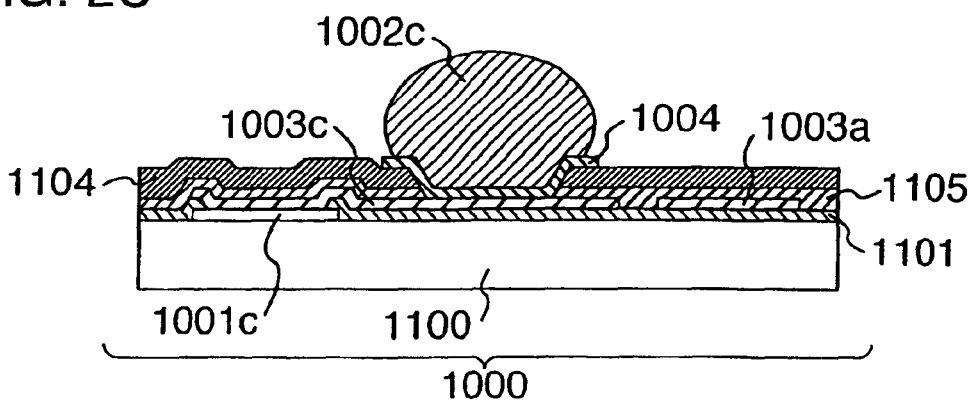

FIG. 1 is a plan view showing a pad forming surface of a semiconductor device according to a first embodiment of the present invention. A semiconductor device 1000 is made up of a semiconductor element 1100 composed of a roughly rectangular silicon chip having sides of several millimeters or several tens millimeters as shown in the section of FIGS. 2A, 2B, 2C, a plurality of pads 1001, a bump forming section 1004, a plurality of bumps 1002, a plurality of wiring sections 1003 for connecting them formed on a pad forming surface 2000 of the semiconductor element 1100. The pads 1001 are further divided into power pads 1001a, ground pads 1001b and signal pads 1001c. The power bumps 1002a are further divided into ground bumps 1002b and signal bumps 1002c. The power wiring sections 1003a are further divided into ground wiring sections 1003b and signal wiring sections 1003c. In this and the other drawings, in order to distinct the power, the ground and the signal bumps, pads and wiring sections from each other, the power and the ground bumps, pads and wiring sections may be hatched. In this embodiment, about the signal wiring sections 1003c other than the power wiring sections 1003a and the ground wiring sections 1003b, the ground wiring sections 1003b are located adjacently on both sides of at least one part of the signal wiring section located in the left hand of the semiconductor device and the power wiring sections 1003a are located adjacently on both of at least one part of the signal wiring section located in the right hand of the semiconductor device. The wiring section is generally as wide as 10 µm to 100 µm.

The sectional structure of the semiconductor device is schematically shown in FIGS. 2A, 2B and 2C. As shown, on the semiconductor element 1100 are laminated a silicon oxide layer 1101 or silicon nitride layer 1102 for protecting the element, a first dielectric layer 1103 for insulating the signal wiring section 1003c from the semiconductor element, the signal wiring section 1003c for electrically connecting the semiconductor element 1100 with a mounting substrate having the semiconductor device 1000 mounted thereon through the signal pad 1001c and the signal bump 1002c, a second dielectric layer 1104 for protecting the power wiring section 1003c not shown in FIGS. 2A, 2B and 2C, the wiring section 1003, the pad 10001 and the semiconductor element 1100 and insulating the mounting substrate, and a bump forming section 1104 served as a platform on which the bump 1102 is to be formed. The signal wiring section 1003c, the power wiring section 1003a and the ground wiring section 1003b are formed in the same process. Hence, the manufacturing process of those sections are not complicated. The silicon nitride layer 1102 is as wide as about 1 to 2 µm. More preferably, the layer 1102 should be formed to have a thickness of about 1.3 µm by means of the plasma process. The first dielectric layer is formed of an organic insulator such as silicon nitride or sensitive PIQ. The first dielectric layer is as thick as 3 to 7 µm, preferably, about 5 µm. The second insulating layer is formed of an organic insulator such as sensitive PIQ and is as wide as 3 to 7 µm, preferably, about 5 µm. The pad 1001 is mainly formed of aluminum and is as thick as 0.6 to 1 µm. The wiring section 1003 is formed of a laminated structure of a chromium layer of 0.1 µm, a copper layer of 3 µm, and a chromium layer of 0.05 µm ranging from a closer side of the semiconductor element or mainly formed of aluminum and ranges from 0.8 to 1 µm in thickness. The bump forming section 1004 is preferably formed of a chromium layer of 0.05 µm, an alloy of nickel and tungsten of 2 µm, and a gold layer of 0.05 µm ranging in this sequence from a closer side to the semiconductor element. The bump 1002 is formed of solder. Though not shown, as disclosed in JP-A-9-260389, about the bump forming section 1004, it is apparent that the gold on the uppermost surface is not covered but may be formed as a circle on a contact portion between the bump 1002 and the bump forming section 1004. In the structure shown in FIG. 2C, the wiring section layer is a lamination mainly formed of aluminum and a protective layer is formed of silicon oxide layer. In this embodiment, the silicon oxide layer is served as the silicon nitride layer 1102 and the first dielectric layer 1103 as shown in FIGS. 2A and 2B. In this case, it is preferable that the silicon oxide layer 1101 is as wide as about 0.11 to 1 µm. More preferably, it should be formed to have a thickness of about 0.3 µm by means of the plasma process. In this embodiment, the dielectric layer overlapped on the wiring section is composed of a second dielectric layer formed of sensitive PIQ and the silicon nitride layer 1105.

As shown in FIGS. 2A, 2B and 2C, according to the invention, the power wiring sections or the ground wiring sections and the signal wiring sections other than the power or the ground wiring sections are formed on the same plane.

Next, the description will be oriented to how the invention of the present application makes the fast operation possible, which is an object of the semiconductor device according to this embodiment.

Figure 3:
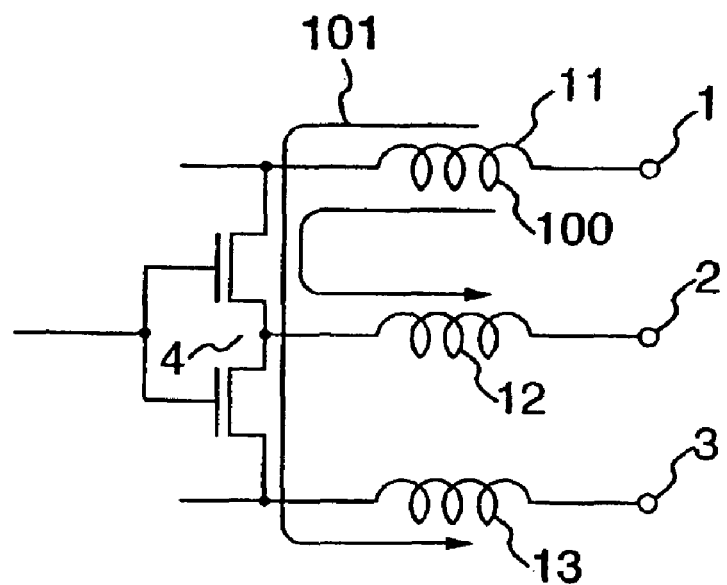
FIG. 3 is an equivalent circuit diagram showing a cause of noise occurrence.

FIG. 3 shows an equivalent circuit for a circuit around an output buffer included in the semiconductor device. In particular, consider the transition of the potential of a data pin 2 from the low state (ground potential) to the high state (power potential). At the transition, of the transistors composing a final stage 4 of an output buffer, the power side transistor is made conductive, so that current 100 flows from a power pin 1 to the data pin through the final stage of the output buffer. This current is charged in the load connected to the data pin 2 so that the potential of the data pin 2 is switched from the low state to the high state. At a time, current 101 flows from the power spin 1 to a ground pin 3 through the final stage of the output buffer. In general, this current is called passage current, which is not preferable to the semiconductor device. However, it is understood that when the buffer is switched, the current has to flow from the power source to the ground in a narrow time range when the transistor composing the buffer is made substantially conductive. When the state of the data pin 2 is transited from the low to the high state, unlike the flow of the current 100 shown in FIG. 3, the current 100 flows from the data pin 2 to the ground pin 3. The current 101 flow from the power pin 1 to the ground pin 3 like the flow of the current 101 shown in FIG. 3.

As described above, at the potential transition of the data pin of the signal pins included in the semiconductor device, for example, as shown in FIG. 3, the transient current starts to flow. Importantly, the flow of the transient current causes the noise voltage to be generated in proportion to a time-base change rate of an inductance and the transient current of each pin ranged along the current passage. Hence, with increase of the operating speed, that is, the operating frequency, the noise is increased. As a result, there exists an upper-limit frequency to be operated at a certain inductance value. In order to enhance the upper limit, it is necessary to reduce the inductance as much as possible. For example, the foregoing conventional semiconductor device has a relatively smaller dimension, which means that it has a smaller inductance than the semiconductor device provided with a lead frame. The present invention provides the semiconductor device which has the roughly same dimension as but a smaller inductance than the conventional semiconductor device. In order to understand this, the readers are required to know that the inductance for giving influence on the transient current 100 shown in FIG. 3 is an effective inductance derived by the inductance 12 of the data pin 2, the inductance 11 of the power pin 1, and a mutual inductance M of the power pin 1 and the data pin 2. For example, assuming that the inductance of the power pin is L1, the inductance of the data pin is L2, and the mutual inductance therebetween is M, the effective inductance about the passage of the transient current 100 shown in FIG. 3 is generally represented as L1+L2−2×M. Since the noise is in proportion to the inductance of the current passage, that is, the effective inductance, in the condition that no change takes place in the inductance L2 of the data pin and the inductance L1 of the power pin, by increasing the mutual inductance M between them, it is possible to reduce the overall effective inductance. It is obvious that the same discussion may hold true to the passage current 101 shown in FIG. 3. In this case, by increasing the mutual inductance between the power pin 1 and the grand pin 3, it is possible to reduce the overall effective inductance.

Figure 4:
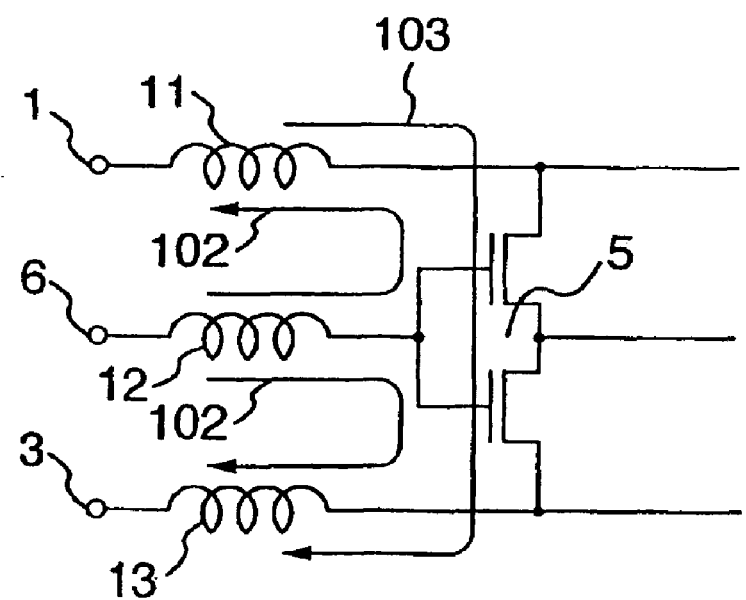
FIG. 4 is an equivalent circuit diagram showing a cause of noise occurrence.

FIG. 4 shows an equivalent circuit corresponding to an address pin 6 and a circuit around the input buffer included in the semiconductor device. Herein, in particular, consider that the potential of the address pin 6 is switched from the low state (ground potential) to the high state (power potential). In this case, when the transition takes place, the transient current 102 starts to flow from the address pin 6 to the power pin 1 and the ground pin 3 through the input buffer 5 and the passage current 103 starts to flow from the power pin 1 to the ground pin 3. The former current is charged in an input capacitance, while the latter current is transient current appearing when the buffer is switched as described above. Even in the input pins such as the address pin of the signal pins, like the data pin, the transient current takes place when the signal is switched and the noise is generated by the inductance of the conductor ranged along the transient current and the current passage. Hence, the method for reducing the noise described with reference to the data pin may be used for these input pins.

In order to reduce the effective inductance, the common printed board is composed of multi-layered substrate in which the ground or the power source is formed of a filmy conductor under the signal lines. However, the semiconductor device provided by the present invention has difficulty in adopting such a multi-layered structure because the cost is restricted. Hence, the semiconductor device of this invention adopts a mono-layered structure as a wiring section layer containing the power source and the ground. Hence, for example, by taking the composition as shown in FIG. 1, it is possible to reduce the distance between the power source or the ground wiring section and the signal wiring section. It leads to reducing the effective inductance of the system of combining the power source or the ground wiring section with the signal wiring section.

In the embodiment shown in FIG. 1, for reducing the effective inductance of the signal wiring section 1003c and the power wiring section 1003a or the signal wiring section 1003c and the ground wiring section 1003b, the power wiring section 1003a and the ground wiring section 1003b are located around the signal wiring section 1003c in a meshed manner. Importantly, the conductor located around the signal wiring section is made to be an electric passage for connecting the power source and the ground located in the output buffer 4 and the input buffer 5 included in the semiconductor element as shown in FIGS. 3 and 4 with the power source and the ground of the mounting substrate on which the semiconductor device is mounted. Hence, about the power wiring section 1003a, the conductor around the signal wiring section 1003c shown in FIG. 3 is required to be connected to the power pad 1001a and the power bump 1002a, while about the ground wiring section 1003b, the conductor is required to be connected to the ground pad 1001b and the ground bump 1002b.

Figure 5:
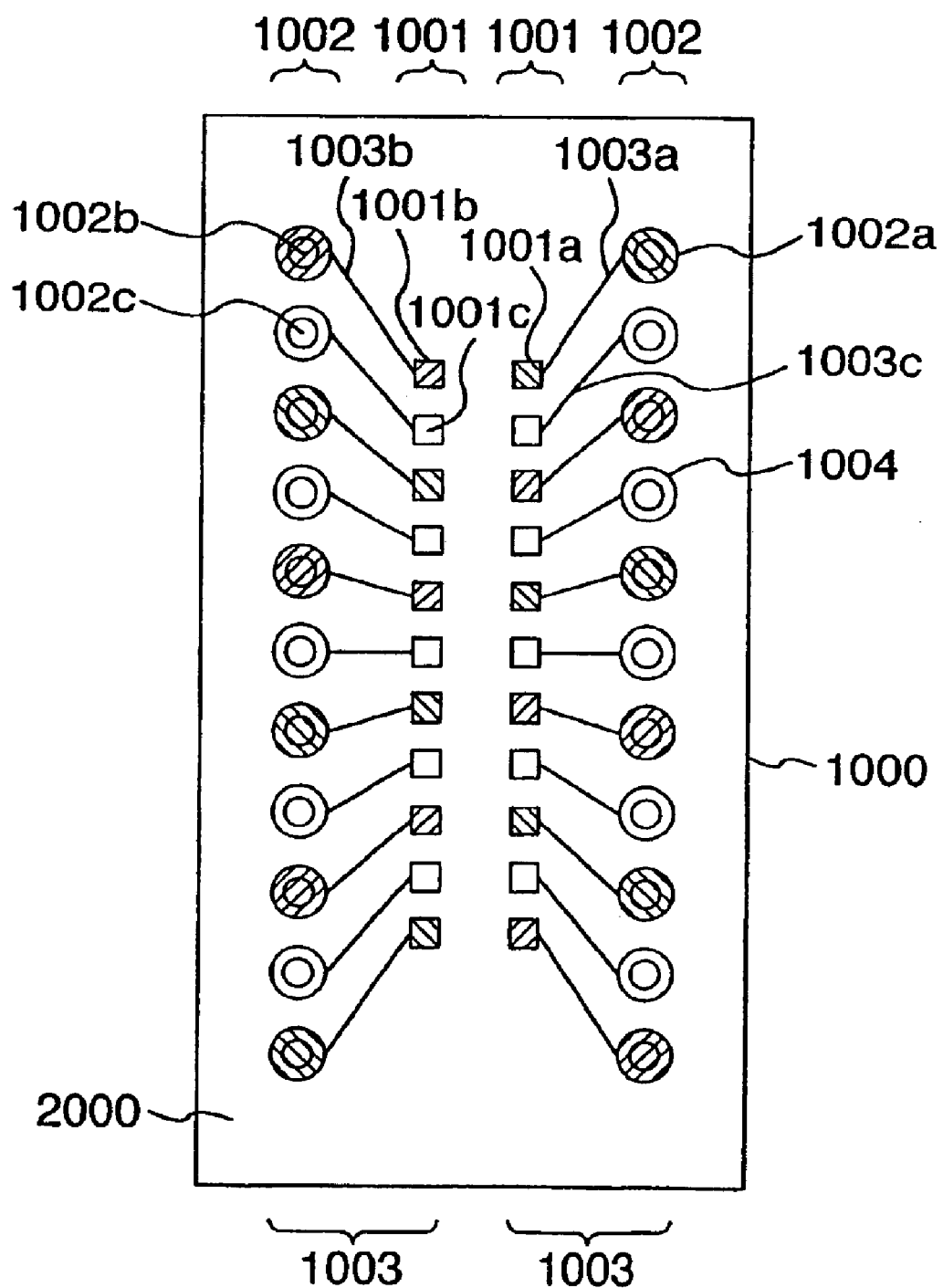
FIG. 5 is a plan view showing a wiring pattern of a semiconductor device according to another embodiment of the present invention.

FIG. 5 is a plan view showing a semiconductor device according to another embodiment of the present invention. In this embodiment, the power wiring section 1003a, the power pad 1001a and the power bump 1002a are located adjacently on one side of at least one part of the signal wiring sections other than the power and the ground wiring sections, while the ground wiring section 1003b, the ground pad 1001b and the ground bump 1002b are located adjacently on the other side thereof. This type of locations results in increasing the number of the pads, the wiring sections and the bumps as compared with this embodiment shown in FIG. 1 but locating all the signal lines between the power and the ground wiring sections. Hence, the transient current generated in the power and the ground wiring sections when the potential of the signal line 1003c is transited is flown through the power wiring section 1003a or the ground wiring section 1003b adjacent to the signal lines. As a result, the effective inductance of these current passages can be made sufficiently smaller. Further, the use of this kind of structure makes it possible to reduce the effective inductance along the passage of the transient current generated in both the power pin and the ground pin when the potential of the address pin shown in FIG. 4 is transited as compared with the effective inductance generated in the structure that only one of the power and the ground wiring sections is adjacent to the signal lines.

Figure 6:
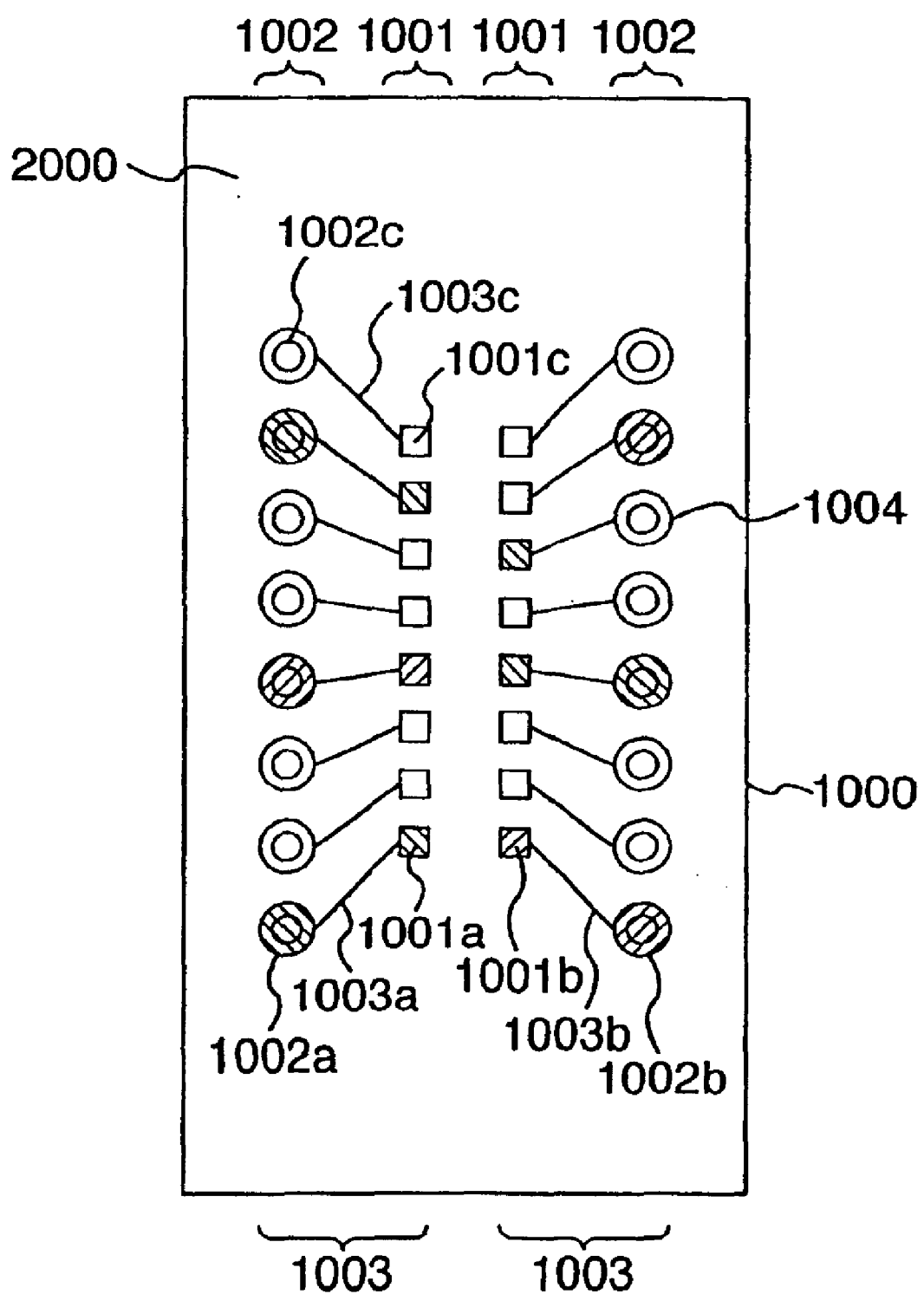
FIG. 6 is a plan view showing a wiring pattern of a semiconductor device according to another embodiment of the present invention.

FIG. 6 is a plan view showing the embodiment structured to suppress the increase of the pads, the bumps and the wiring sections in number, which is likely to take place in the embodiment shown in FIG. 5. By forming one of the power wiring section 1003*a* and the ground wiring section 1003*b* adjacent to one side of at least one part of all the signal wiring sections 1003*c*, the total number of pins is made advantageously smaller though the effective inductance of the passage through which the transient current flows is somewhat larger as compared with the embodiment shown in FIG. 5. In actual, the composition of this embodiment has a smaller number of pins than that of the embodiment shown in FIG. 5 though it has the same number of signal pins.

Figure 7:
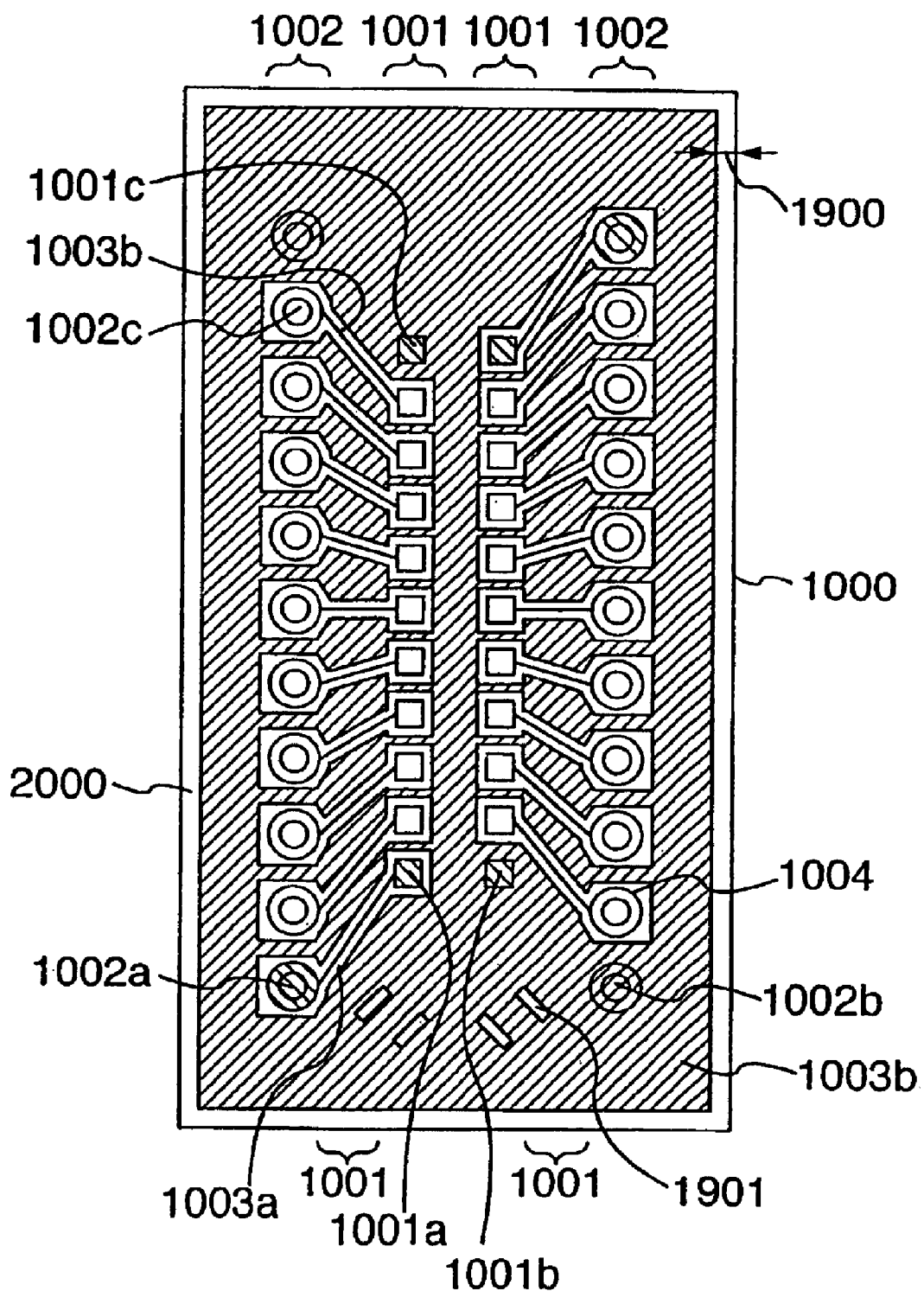
FIG. 7 is a plan view showing a wiring pattern of a semiconductor device according to another embodiment of the present invention.
Figure 8:
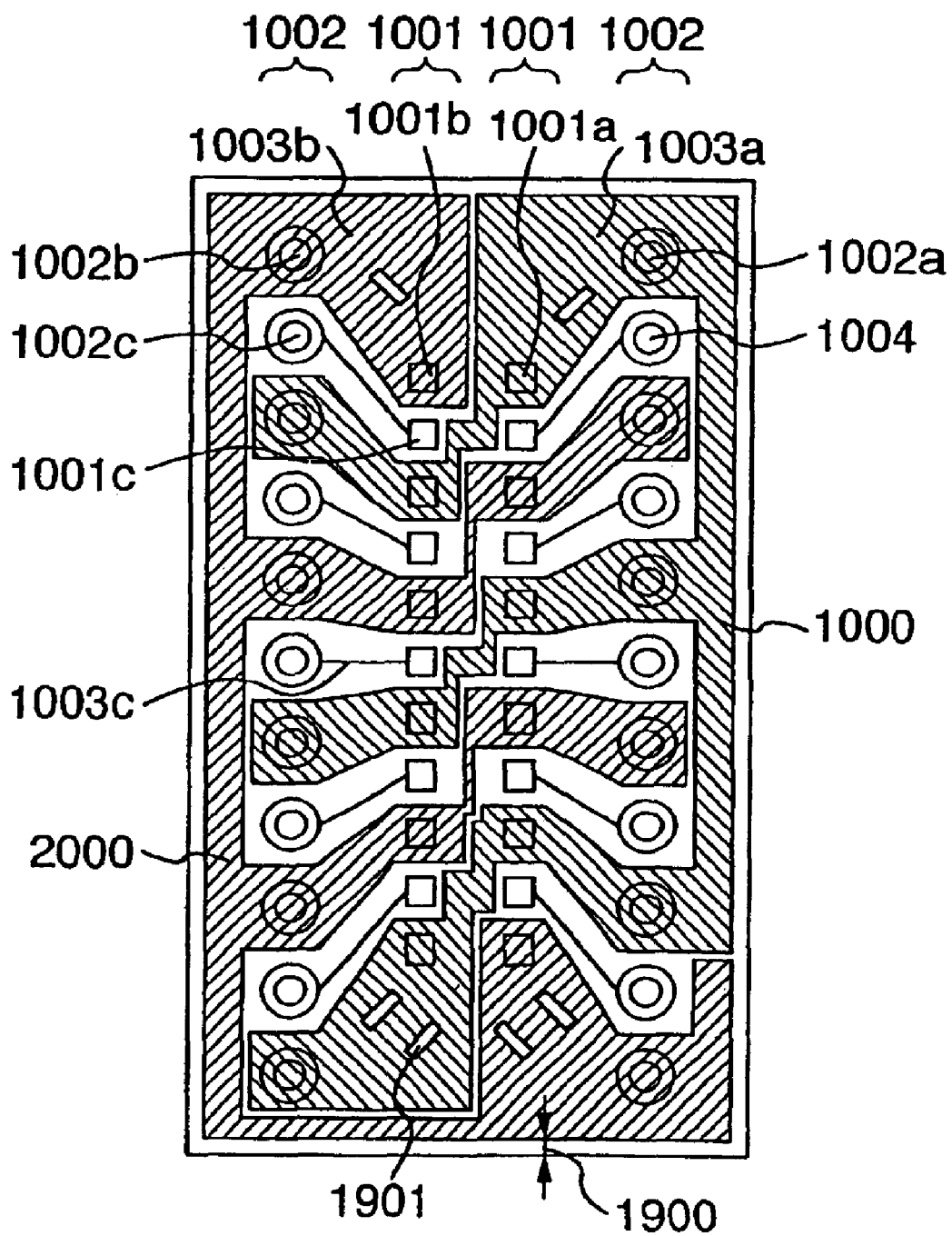
FIG. 8 is a plan view showing a wiring pattern of a semiconductor device according to another embodiment of the present invention.

The above-mentioned embodiments have been described on the assumption that the power wiring section 1003*a* and the ground wiring section 1003*b* have the same wiring section width as the signal line. However, like the foregoing embodiments of the present invention as shown in FIGS. 7 and 8, by keeping the width of the power or the ground wiring section larger than the width of the signal line and connecting the power wiring section with the ground wiring section though those wiring sections are located independently in the embodiments shown in FIGS. 5 and 6, the effective inductance of the power and the ground wiring sections may be further reduced. Further, the embodiments shown in FIGS. 7 and 8 are also advantageous in screening light from the semiconductor element. In general, it is known that the semiconductor element mainly formed of silicon may malfunction because of the exposure to the infrared light. In this embodiment, by covering an active portion and a peripheral portion of the semiconductor element that is likely to be exposed by the infrared light with the power wiring sections and the ground wiring sections, the malfunction rate may be reduced. Moreover, by screening alpha rays radiated from a member containing heavy metal such as solder with the power and the ground wiring sections located closer to a solid layer of this embodiment, it is possible to advantageously prevent malfunction of the semiconductor device caused by the alpha rays.

Like the present embodiment, if the conductor closer to the solid layer is provided on a pad forming surface of the semiconductor device 1000, it is preferable to form it in a somewhat inner portion than the outermost peripheral portion of the semiconductor device 1000 formed of a silicon chip. In the formation of the semiconductor device of this embodiment, the semiconductor element, the pads, the wiring sections and the bumps are formed on a silicon wafer at a batch and then the resulting wafer is cut into chips along a scribed line. In this formation, the cutting blade may be served to cut the metallic layer such as the ground layer or the power layer of the semiconductor device though the blade should originally cut out the silicon chip. In this case, the blade may be often impaired and burr is caused on the metallic layer when being cut out. The burr may leads to stripping. In order to avoid this, as described with respect to this embodiment, it is preferable to locate an escape 1900 of the scribed line on the outmost peripheral portion of the semiconductor device and form the conductor layer inside of the escape 1900.

In order to improve adherence of the conductor layer and increase the reliability, when forming a large conductor layer, it is preferable to provide a hole 1901 for improving the adherence of the conductor layer on the surface of the conductor layer. This hole serves to improve adherence as well as exhaust gas generated on the interface. The hole should be small enough to keep the current smoothly flowing or elongated along the current so as not to prevent the current flowing between the pad and the bump.

The embodiment shown in FIG. 7 is composed so that the conductor is closer to the solid layer by widening any one of the power wiring section and the ground wiring section. In particular, in FIG. 7, the foregoing structure is applied to the ground wiring section. The present structure makes it possible to advantageously reduce the effective inductance of the ground wiring section, improve the lightproofness, and form a visor layer from the alpha rays. As shown in FIG. 8, more advantages may be provided by widening the ground wiring section and the power wiring section for making the conductor closer to the solid layer. As has been described with reference to FIG. 3, depending on the switching direction of the data, the transient current flows through the signal wiring section, the power wiring section, the ground wiring section, or both of the wiring sections. Hence, as shown in FIG. 8, by treating the power wiring section and the ground wiring section equally and widening the power and the ground wiring sections, the effective inductance along the passage of the transient current may be reduced independently of the signal switching.

Figure 9:
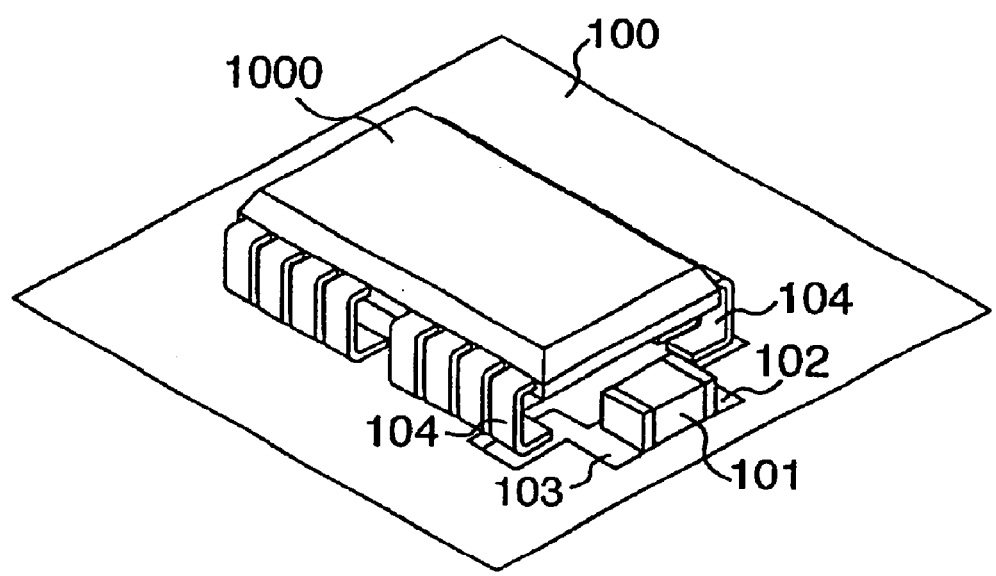
FIG. 9 is a perspective view showing a mounting state of the semiconductor device and the chip capacitor.

By making the power and the ground wiring sections tabular, covering the pad forming surface of the semiconductor device and locating the power wiring section 1003*a* closer to the ground wiring section 1003*b* like the present embodiment, it is possible to advantageously compose a path capacitor with excellent high frequency. As shown in FIG. 9, the general semiconductor device is composed to pull out the power wiring section 102 and the ground wiring section 103 from the power pin and the ground pin of the semiconductor device onto the mounting substrate 100 and locate a small-sized chip capacitor on the substrate as a path capacitor for electrically connecting the chip capacitor with the wiring sections. Hence, the passage from the semiconductor device to the chip capacitor is made longer, so that the effective inductance of this passage is made relatively larger. As a result, though the chip capacitor itself has an excellent frequency characteristic, the path capacitor may not often perform its role against the noises having a frequency of several tens MHz or more. According to the present invention, the path capacitor is composed of the power wiring section 1003*a* and the ground wiring section 1003*b* themselves. It means that the effective inductance between the path capacitor and the semiconductor device is remarkably small. Therefore, the path capacitor performs its role against a roughly tenfold frequency of the ordinary chip capacitor as a limited frequency. It should be noted that the path capacitor composed by this embodiment has a capacitance of several pF and cannot be completely replaced with the chip capacitor generally having a capacitance of 0.1 to several micro F. Even if, therefore, the semiconductor device of this embodiment is used on the mounting substrate, the ordinary chip capacitor is used. However, the reduction of the noises is made possible in a wide frequency range by connecting the path capacitor and the chip capacitor in parallel, the patch capacitor being included in the semiconductor device of this embodiment and connected to the power and the ground of the semiconductor device at a small effective inductance and the chip capacitor having a large capacitance but a slightly degraded high frequency characteristic.

Further, the present embodiment has a structure having lots of cuts on the surface and the power and the ground wiring sections twisted therewith unlike the other structure in which the power and the ground wiring sections are one large filmy table. This structure of the present embodiment is served to reduce the internal stress caused in forming the wiring layer, thereby preventing the stripping of the conductive layer caused by the internal stress. In order to improve adherence and reliability of the conductive layer, when forming a large conductive layer, it is preferable to form a hole 1901 for improving the adherence of the conductive layer on the surface of the conductive layer. In the case of forming the hole, it is preferable to make the size of the hole small so that the flow of the current cannot be prevented by the hole or elongate the hole along the flow of the current. Further, this hole serves to vent the gas caused on the interface.

The embodiments shown in FIGS. 7 and 8 are composed for solving the problems as to how the tabular power layer and the tabular ground layer are located if lots of pads and bumps are located on the surface of the chip, the solutions of which are not shown in the semiconductor device disclosed in JP-A-6-163822. Further, the embodiment shown in FIG. 8 provides the structure of reducing the noises generated in both the power wiring section and the ground wiring section, which structure is not suggested in the semiconductor device disclosed in JP-A-6-163822.

Figure 10:
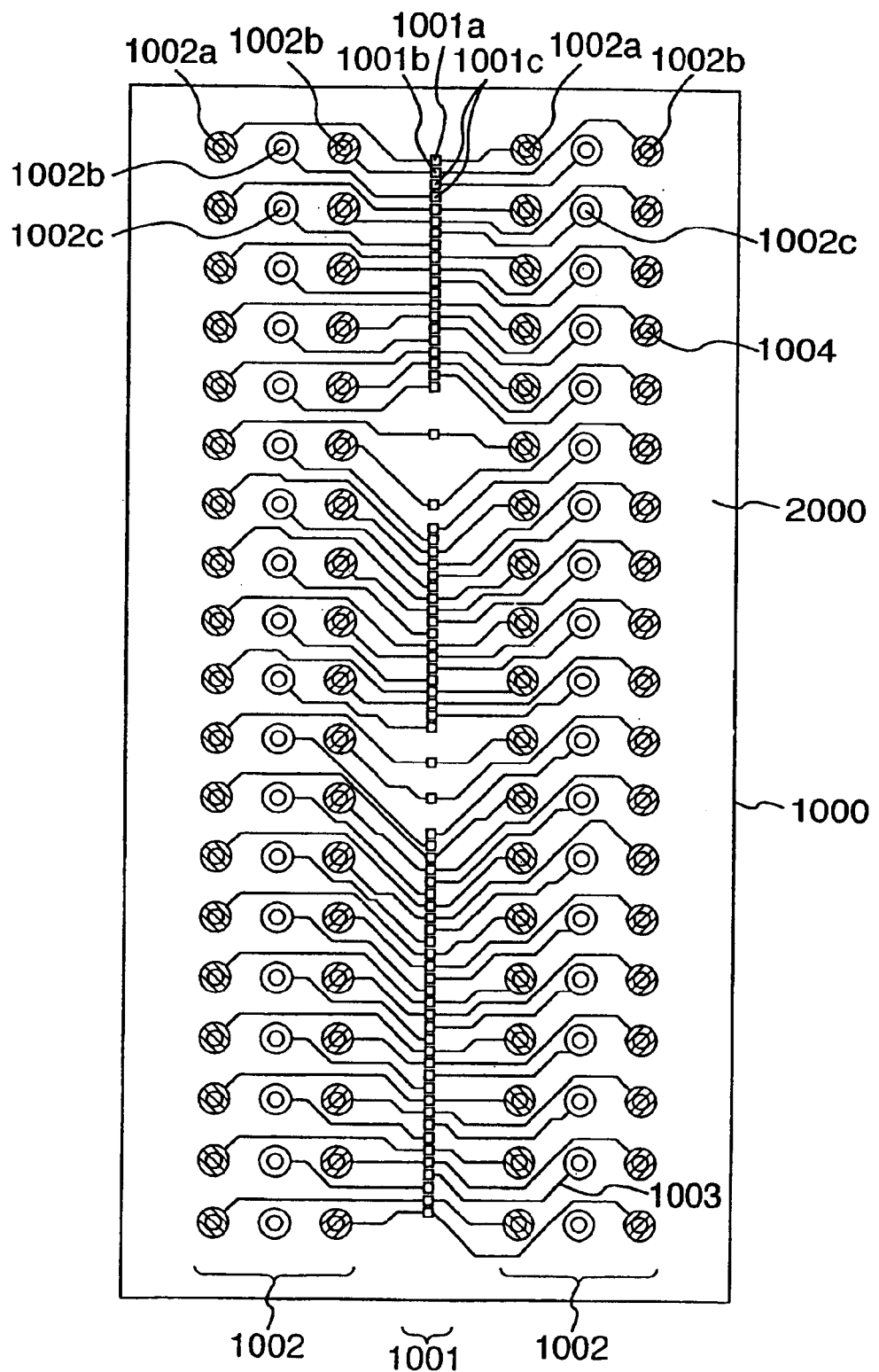
FIG. 10 is a plan view showing a wiring pattern of a semiconductor device according to another embodiment of the present invention.

FIG. 10 shows a semiconductor device according to another embodiment of the present invention. The semiconductor device is structured to have one pad sequence on the center of the surface, which device is often used in the memory device included in the semiconductor device. In this embodiment, one pad sequence located around the center of the surface is composed of a repetition of the power pad 1001a, the ground pad 1001b and at least one signal pad 1001c. The wiring sections from the power-pad 1001a and the ground pad 1001b are pulled out to the right and the left side and then are connected to the corresponding power bump 1002a and ground bump 1002b at two points. This structure allows all the signal wiring sections 1003c to be located between the power wiring section 1003a and the ground wiring section 1003b. As described with reference to the foregoing embodiment, even at any transit of the potential of the signal line 1003c, the transient current starts to flow through the power wiring section 1003a or the ground wiring section 1003b adjacent to the signal line in which the potential is transited. Hence, the effective inductance of the passage of the transient current may be reduced. This structure, therefore, may provide the semiconductor device that is operable at a fast speed and low noises.

Figure 11:
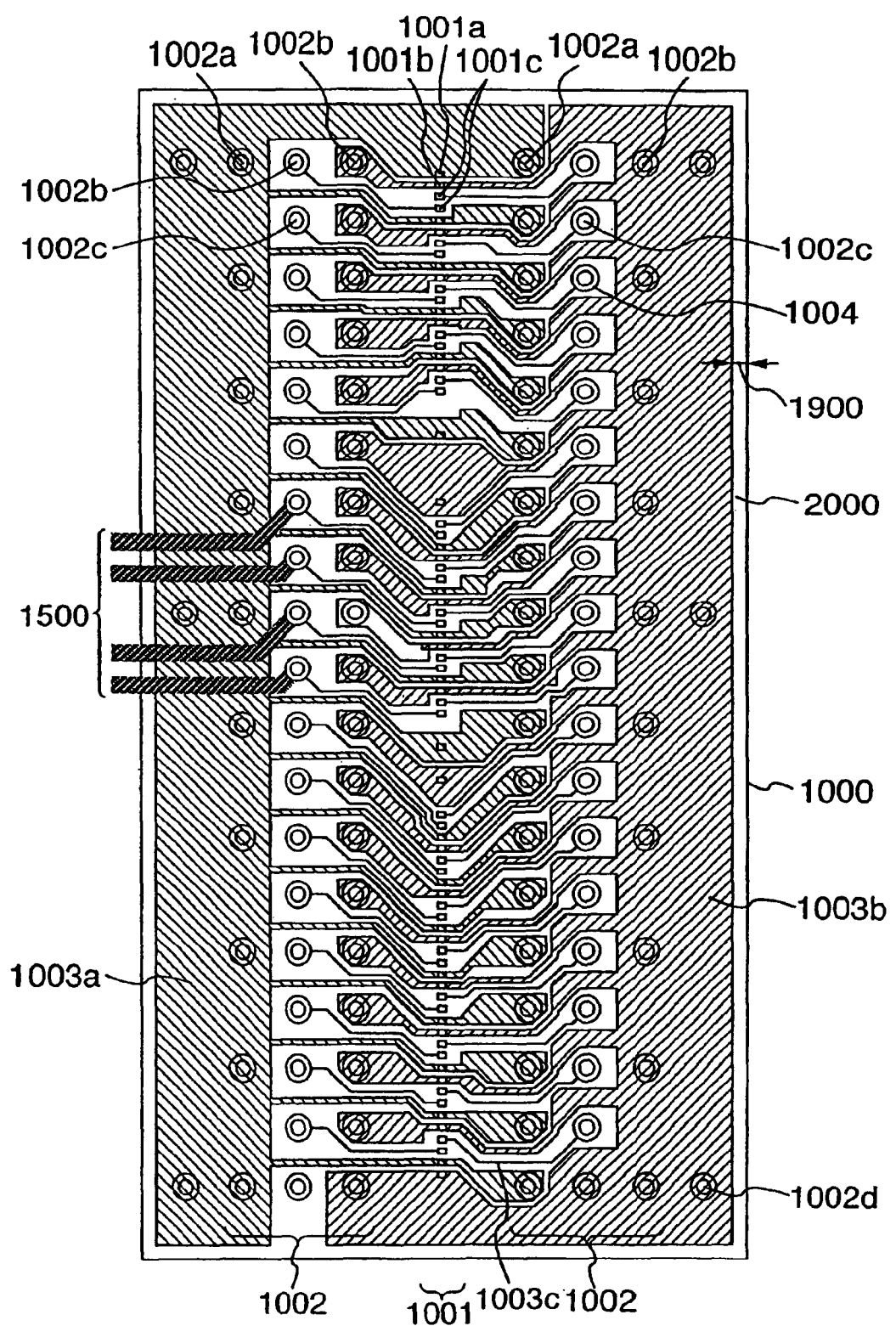
FIG. 11 is a plan view showing a wiring pattern of a semiconductor device according to another embodiment of the present invention.

The structure shown in FIG. 11 is the embodiment shown in FIG. 10 except that the power wiring section 1003a and the ground wiring section 1003b are widened and the power bumps 1002a and the ground bumps 1002b are connected to each other if they may be connectable. In the connection, by reducing the number of the power bumps 1002a and the ground bumps 1002b located on the outer peripheral portion, the signal wiring sections connected to the mounting substrate through the signal bumps 1002c are likely to be pulled to the outside through the surface wiring sections 1500 of the mounting substrate. Normally, the wiring section of the mounting substrate is larger in wiring section width and wiring pitch than the wiring section located on the semiconductor device like this embodiment. If lots of power bumps and ground bumps are located on the outermost peripheral portion of the semiconductor device, it may be difficult to pull out the signal wiring sections between the bumps with the surface wiring sections of the mounting substrate. In the structure of this embodiment, for pulling out the signal wiring sections from the semiconductor device onto the mounting substrate, the through hole and the inner layer are not necessary, which leads to lowering the cost of the mounting substrate. Like this embodiment, even if the power bumps 1002a and the ground bumps 1002b located on the outermost peripheral portion are reduced in number, since the power bump 1002a and the ground bump 1002b are connected with each other by the power wiring section and the ground wiring section having a wider wiring width, the effective inductance along the passage of the transient current is sufficiently small. Moreover, the outer peripheral portion of the semiconductor device to which the light containing the infrared light is likely to enter is covered with the tabular power and power wiring sections, thereby preventing the malfunction. Furthermore, since this embodiment is structured to widen the power wiring section 1003a and the ground wiring section 1003b, the resulting semiconductor device has an excellent dissipation. As shown in FIG. 11, since the bump 1002d for improving the dissipating performance may be located on the power wiring section 1003a or the ground wiring section 1003b if necessary, the bump for heat release may be located on the bump-locating possible portion corresponding to the expected heat release value. The bump for improving the dissipating performance is more expected to improve the dissipating performance than the heat release dummy bump that is not electrically connected with the semiconductor element or the signal bump for heat release, because the power wiring section 1003a having a wider width is connected to the semiconductor element through the ground wiring section 1003b, the power pad 1001a and the ground pad 1001b and the bump for improving the dissipating performance may be located on the outer peripheral portion of the semiconductor element. Additionally, of the bumps 1002d added for improving the dissipating performance, the bump located on the outer peripheral portion of the semiconductor device, in particular, around a corner portion of a roughly rectangular semiconductor device is also effective in improving mechanical reliability of the semiconductor device. In general, the semiconductor device is mainly formed of silicon, while the mounting substrate is mainly formed of an organic material. The stress caused by the difference of a thermal expansion coefficient therebetween is induced to the bump located at a joint portion between the semiconductor device and the mounting substrate, in particular, the bump at the corner. This stress causes the solder ordinarily used as the bump materials to be cracked, thereby making the electric connection out of order. The bump 1002d for improving the dissipating performance, additionally provided in this embodiment, is located at the corner. Hence, it serves to improve the dissipating performance and reinforce the device, which offers an advantage of improving the mechanical reliability of the semiconductor device.

Figure 12:
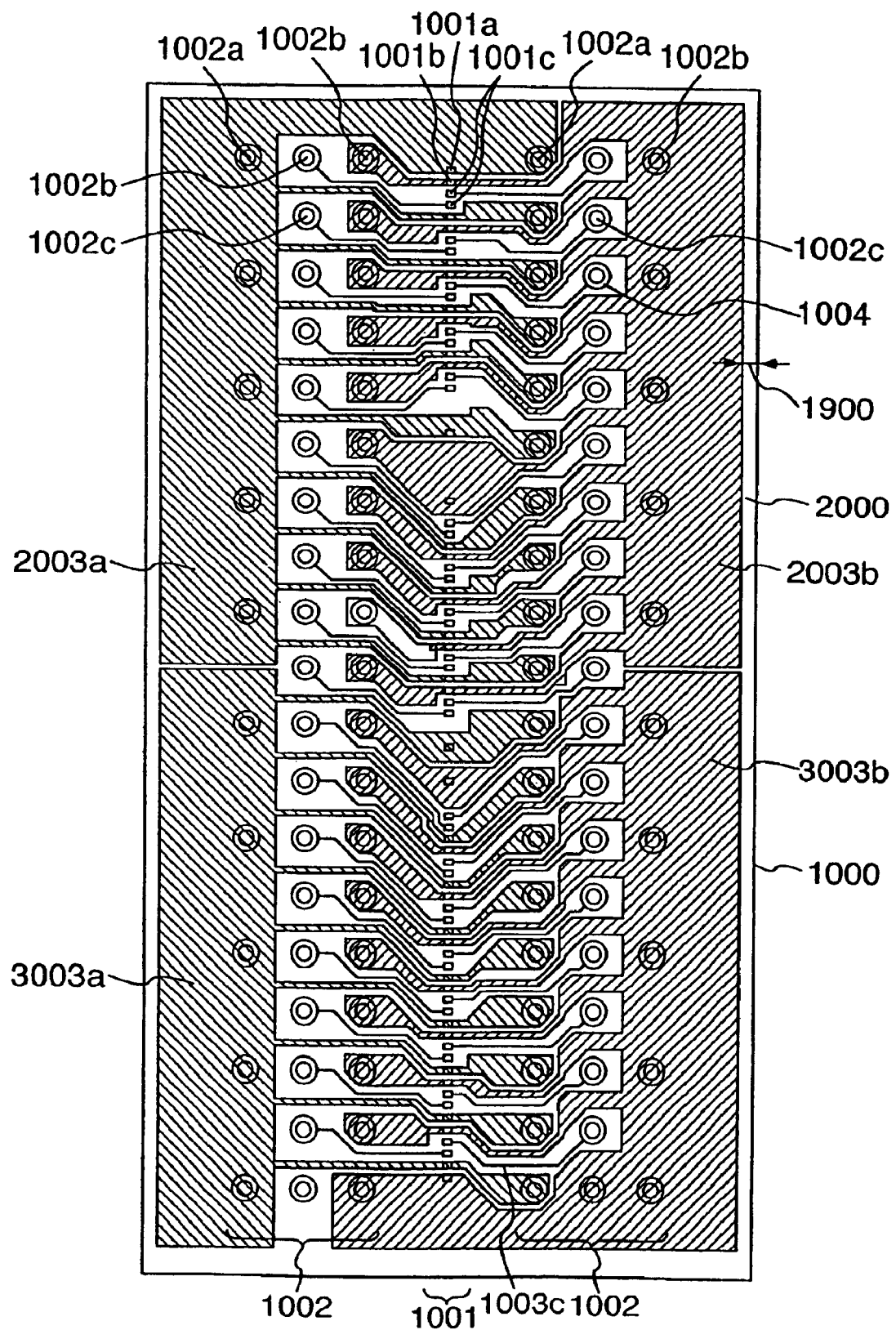
FIG. 12 is a plan view showing a wiring pattern of a semiconductor device according to another embodiment of the present invention.

The present embodiment is presupposed to provide the semiconductor device 1000 with one kind of power wiring sections and one kind of ground wiring sections. However, the current semiconductor device may need various kinds of power and ground wiring sections. In such a case, the present invention is effective. FIG. 12 shows the semiconductor device having the power and the ground pads for the output buffer and the power and the ground pads for the other purposes to which the invention of the present application is applied. The semiconductor device of this embodiment includes the power pad and the ground pad for the output buffer, the power pad and the ground pad for the circuit, the power wiring section 2003a and the ground wiring section 2003b for the output buffer, and the power wiring section 3003a for the circuit, those wiring sections of which correspond to the former pads. In this case, the output buffer, that is, the data pin pad is located in the upper half of the figure. In correspondence, the power wiring section 2003a for the output buffer, the ground wiring section 2003b for the output buffer, the power bump 1002a, and the ground bump 1002b, the latter two of which are connected to the former two, are all located in the upper half of the figure. On the other hand, the signal pin pads except the data pin, such as an address pad, are located in the lower half of the figure. In correspondence, the power wiring section 3003a and the ground wiring section 3003b connected to the circuit except the output buffer through the pad and the power bump 1002a and the ground bump 1002b connected to these wiring sections are all located in the lower half of the figure. This location allows the data pin 2 connected to the output buffer final stage 4 inside of the semiconductor element, the power pin 1 connected to the output buffer final stage 4, and the ground pin 3 to be located closer to each other. Hence, the effective inductance along the flow of the transient current may be reduced. The resulting semiconductor device may be operated at low noises and a fast speed.

Figure 13:
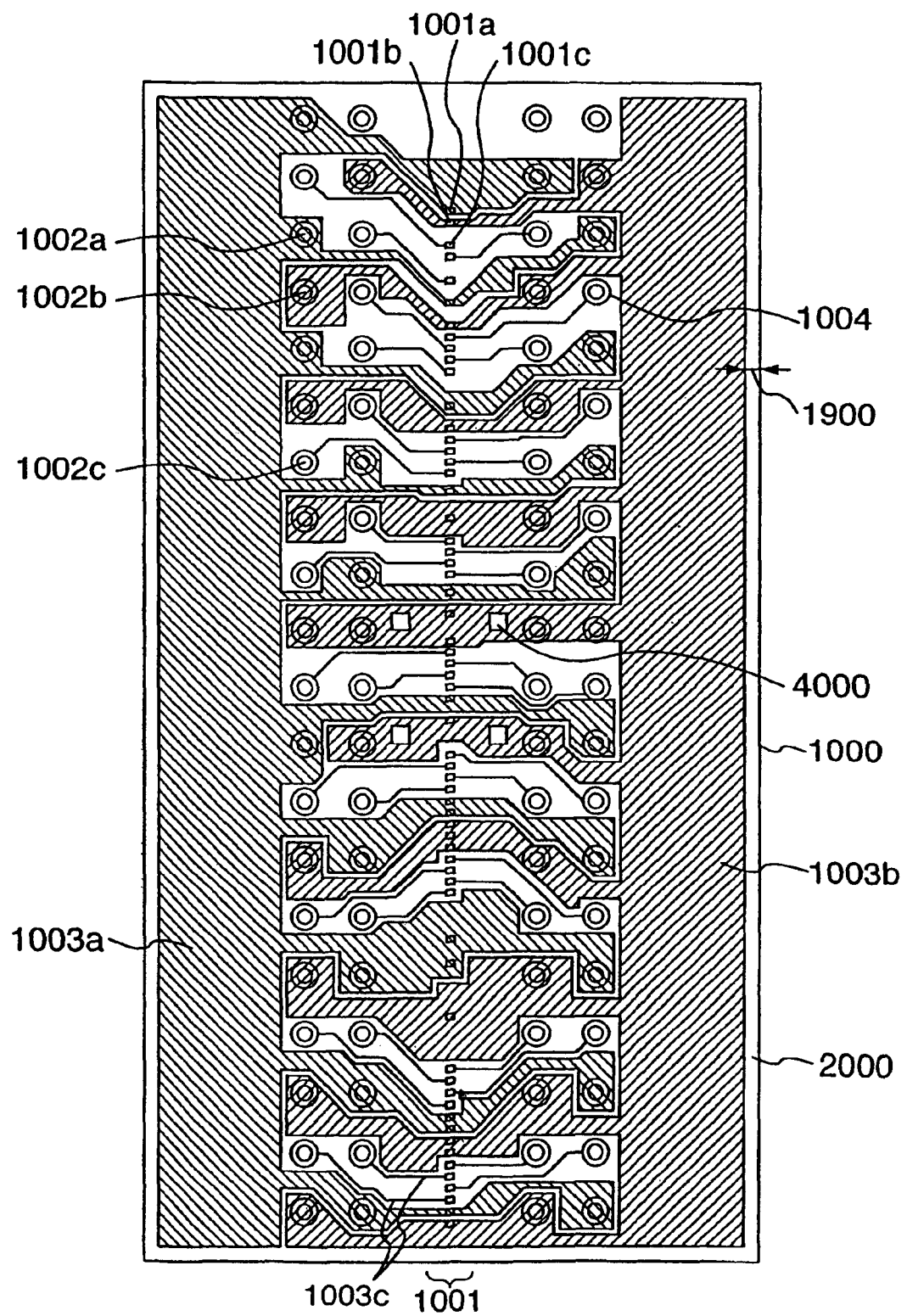
FIG. 13 is a plan view showing a wiring pattern of a semiconductor device according to another embodiment of the present invention.

FIG. 13 is a plan view showing another embodiment of the present invention. The present embodiment overcomes the following problem of the embodiments shown in FIGS. 11 and 12. Though these foregoing embodiments are composed to locate the power wiring section and the ground wiring section on both sides of all the signal lines and reduce the effective inductance along the flow of the transient current, thereby making the fast operation at low noises possible, they are likely to increase the pads 1001, the bumps 1002 and the wiring sections 1003 of the semiconductor device in number. This is the problem of these foregoing embodiments. In this embodiment, a sequence of the pads 1001 located roughly on the center of the semiconductor device 1000 is a repetition of the basic patterns of the power pad 1001a, the ground pad 1001b and four signal pads 1001c. At least one of the wiring sections adjacent on the right and the left of any signal line is formed as the power wiring section 1003a or the ground wiring section 1003c. In this embodiment, only one of the power wiring section and the ground wiring section is located adjacently on both sides of the signal line. Hence, as compared with the structure wherein both the power wiring section and the ground wiring section are located, the present embodiments allows the effective inductance along the flow of the transient current to be made somewhat larger. However, since the pads, the wiring sections and the bumps may be reduced in number, the area of the semiconductor device may be reduced. Hence, the resulting semiconductor device is small-sized and inexpensive. In addition, the bump 1002 that is not connected to the pad by the wiring section 1003 is illustrated in FIG. 13. This bump is not electrically connected to the inside of the semiconductor device.

In FIG. 13, a numeral 4000 denotes an opening for exposing a fuse portion on the semiconductor element. In general, the memory device includes more memory cells formed on a silicon chip than the specified capacitance so that those extra memory cells are all connected to the pads. At the stage of testing the memory device, the wiring section leading from the block containing the defective memory cell to the pad is cut out by applying a laser beam for the purpose of obtaining the memory device of the specified capacitance. The area used for cutting out the wiring section by the laser beam is called a fuse. Hence, in the case of applying the semiconductor device of this embodiment into the memory device, the conductor for composing the wiring section has to be averted from the fuse portion so that the wiring section on the semiconductor element may be cut out by the laser beam. As an area for this purpose, an opening 4000 for exposing the fuse portion on the semiconductor element has to be located on the particularly large power wiring section or ground wiring section. In addition, this area is not required to be a hole-like opening. If it may be geometrically designed, any structure in which the fuse area averts the conductors may be used.

Figure 14:
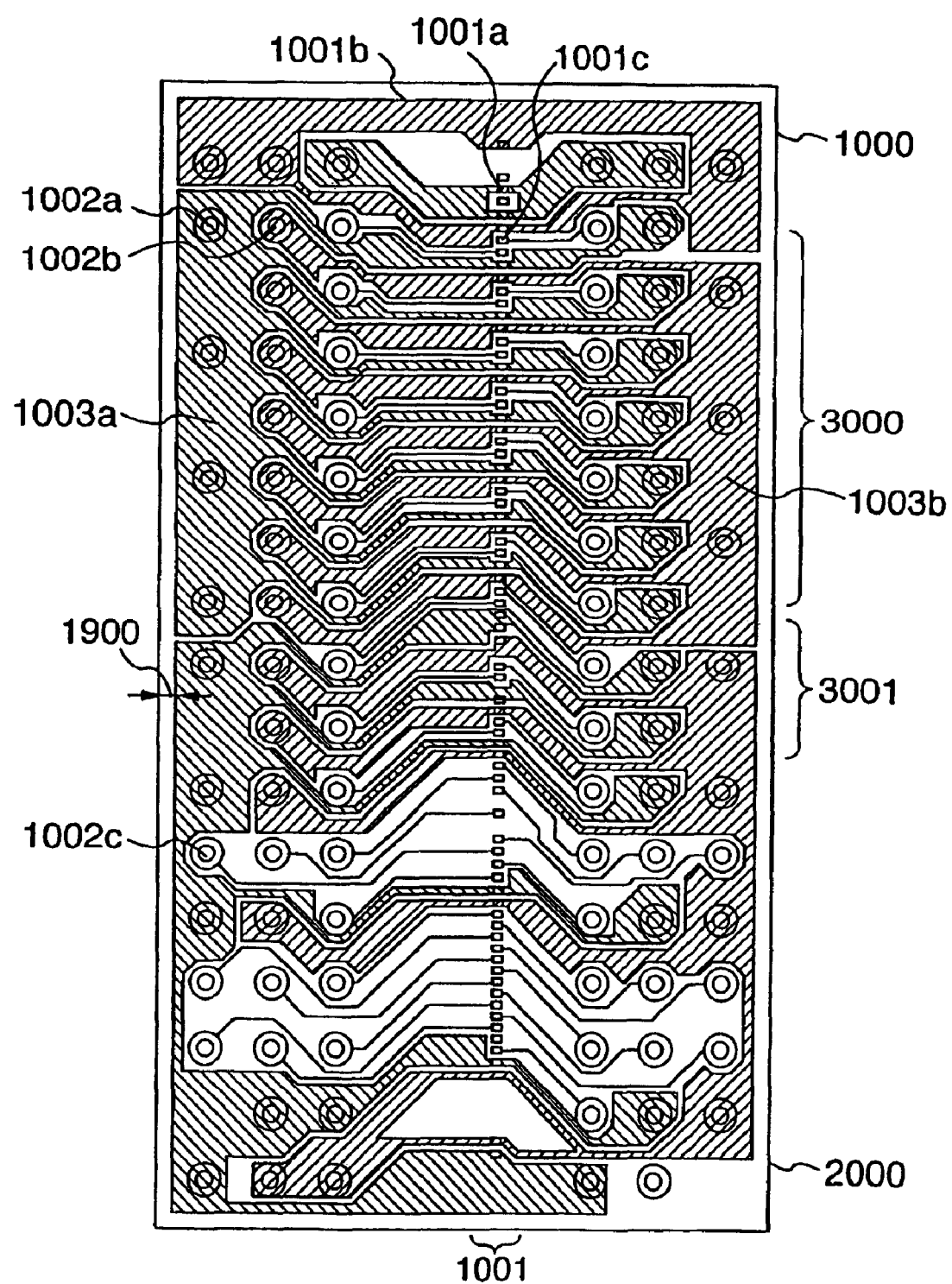
FIG. 14 is a plan view showing a wiring pattern of a semiconductor device according to another embodiment of the present invention.

FIG. 14 shows another embodiment of the semiconductor device which is structured to reduce the increase of pins in number by the different method from the foregoing embodiment, lessen the effective inductance along the flow of the transient current, and be operative at a fast speed and low noises. In the present embodiment, a specific area of the pad forming surface 2000 of the semiconductor device includes the corresponding pads to data, clock, write-enable, and data-mask pins, which have a higher switching frequency and a larger transient current caused in the switching than the other signal pins. These pads are arranged in the sequence of the power pad 1001a, the ground pad 1001b and two signal pads. On the other hand, the signal pins except those specific signal pins, such as an address, a clock enable, a column address strobe and a low address strobe, have a lower switching frequency and a smaller transient current. Hence, for these signal pins, the number of the power pads and the ground pads is reduced. This makes it possible to reduce the effective inductance along the flow of the transient current about the data wiring sections that are likely to generate noises and block the faster speed and, about the overall semiconductor device, reduce the number of the wiring sections, the bumps and the pads, thereby making the fast operation possible and the overall device smaller in size and lower in cost.

Figure 15:
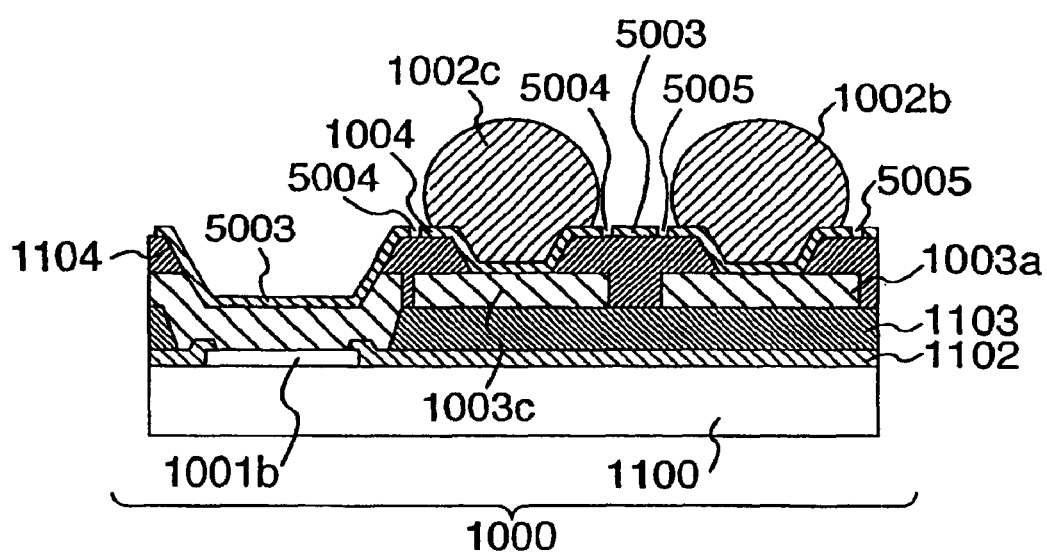
FIG. 15 is a sectional view showing a semiconductor device according to another embodiment of the present invention.
Figure 16:
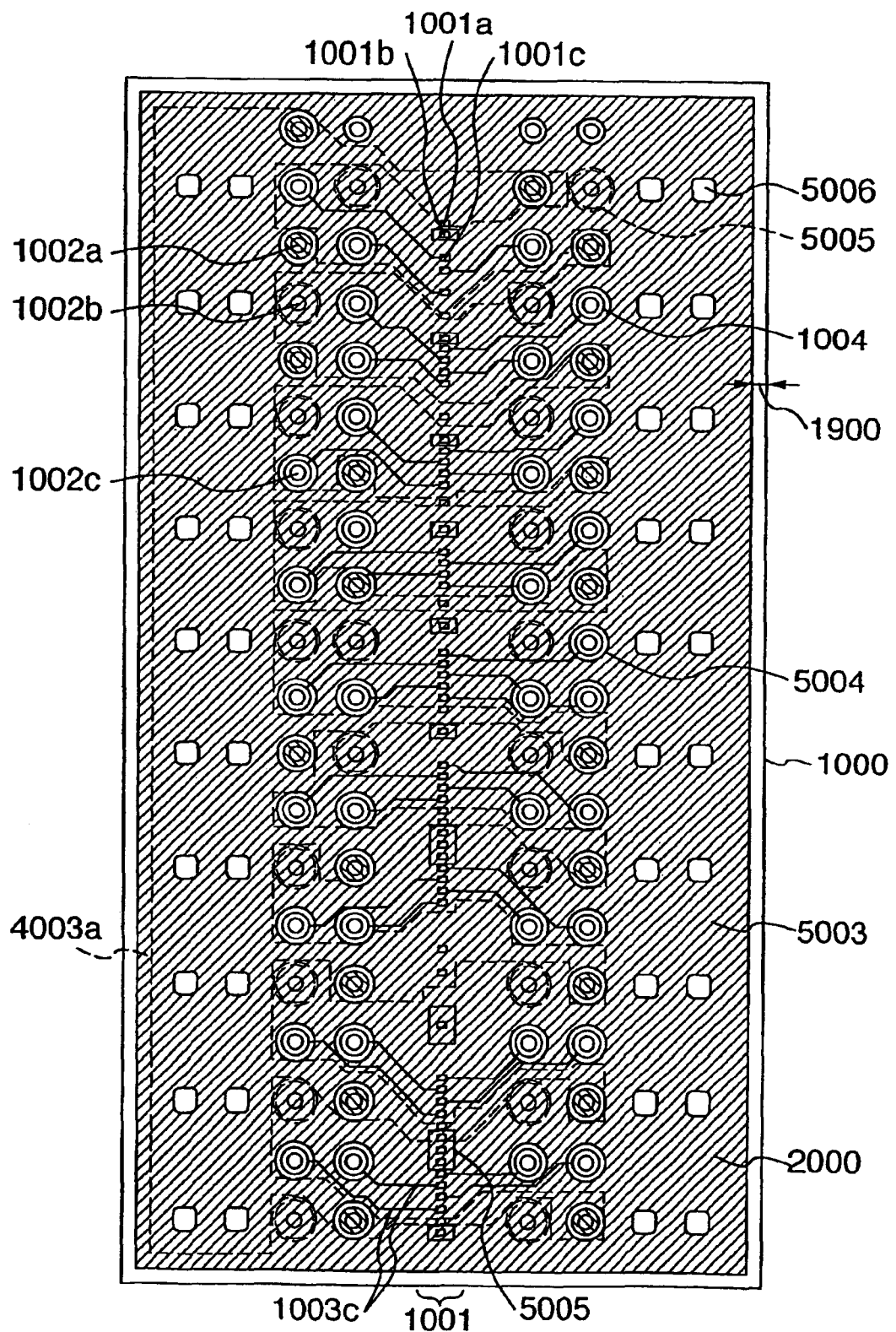
FIG. 16 is a plan view showing a wiring pattern of a semiconductor device according to another embodiment of the present invention.
Figure 17:
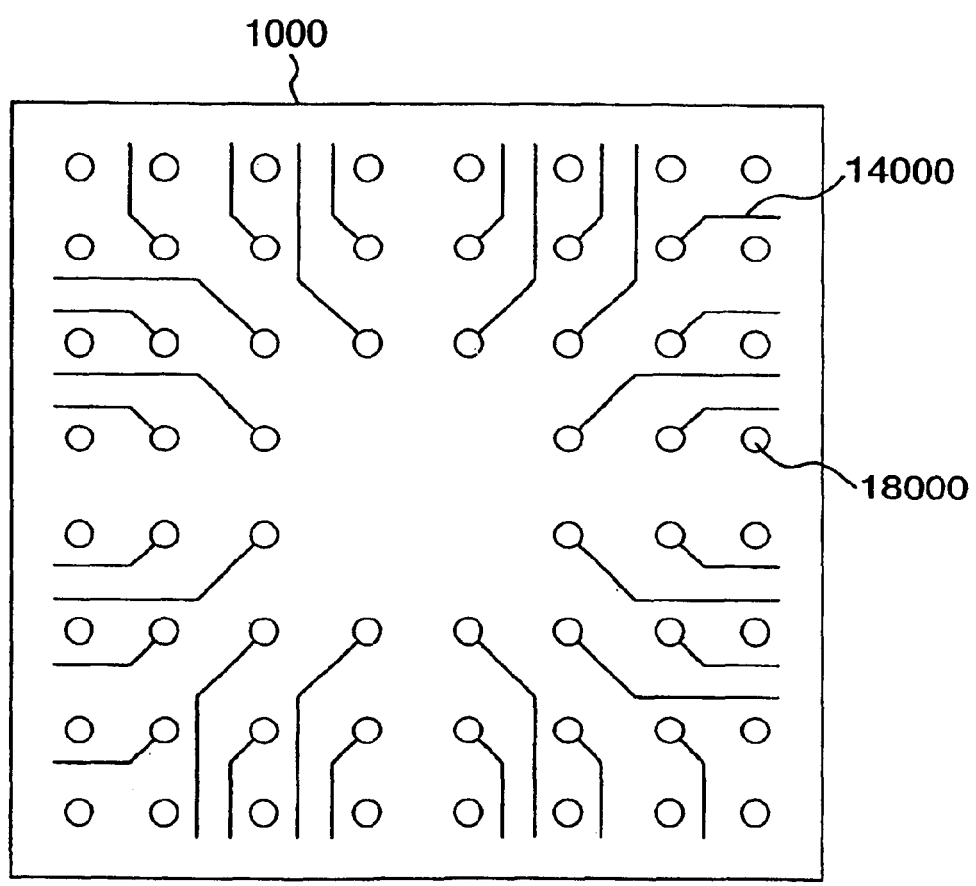
FIG. 17 is a plan view showing a semiconductor device according to an prior art.
Figure 18:
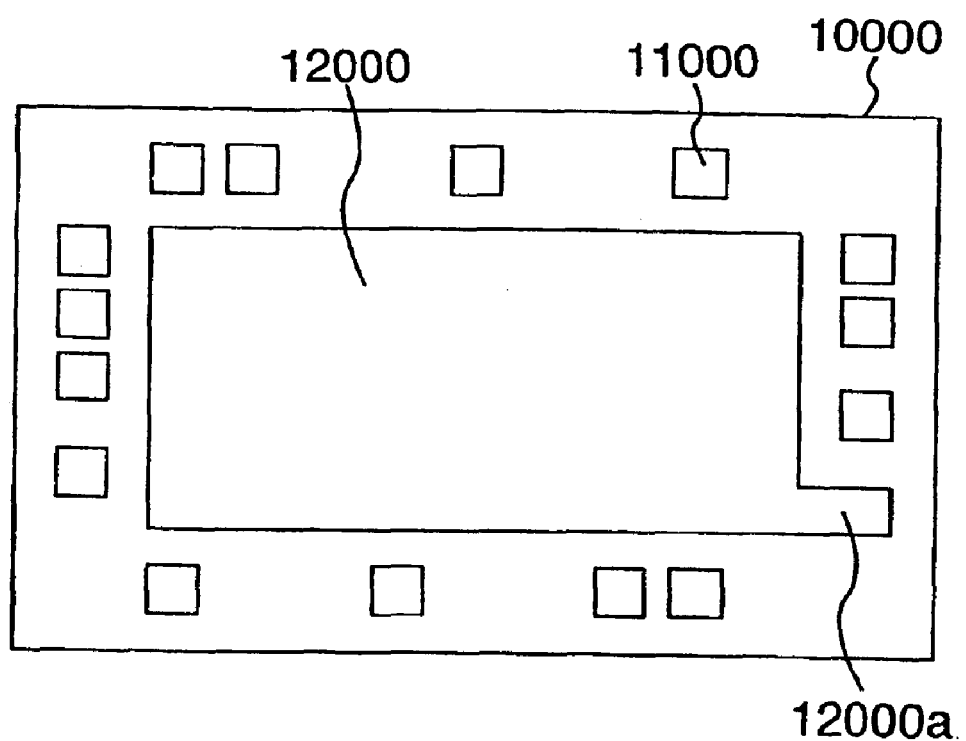
FIG. 18 is a plan view showing a semiconductor device according to another prior art.

FIG. 15 is a sectional view showing another embodiment of the present invention. The present embodiment is structured to makes the conductor layer larger in area and tabular and use the conductor layer as the ground wiring section or the power wiring section. The foregoing embodiments have been structured to use the conductor layer only on the forming portion 1004 of the bump formed of solder. In FIG. 15, the conductor of the bump forming portion is made larger in area and is used as a ground layer 5003 having a different height from the semiconductor element 1100 from the ordinary signal wiring section 1003c, the power wiring section 1003a and the ground wiring section 1003b. Of course, conversely, this conductor may be used as another power layer. In this embodiment, the signal wiring section 1003c and the power wiring section 1003a are formed on the first dielectric layer and the ground layer is formed on the second dielectric layer. The ground layer 5003 of this embodiment includes a portion to be removed according to a process accuracy around these pads and bumps so that the ground layer 5003 is not electrically short-circuited with the power pad 1001a, the signal pad 1001c, the power bump 1002a and the signal pad 1002c. In this embodiment, a gap 5004 for limiting the position and the size of the bump is formed around the bump of another ground layer 5003 formed used for the bump forming portion. In forming the bump, the bump ordinarily formed of solder has excellent adherence to the conductor and wettability so that the solder may be freely flown and expanded, thereby being deformed. This gap 5005 is used for preventing the deformation and the shift of the bump. As shown in FIG. 16, it is preferable that this gap 5005 is formed of plural arcs, because it keeps the form of the bump roughly circular and removes any corner portion where stress is concentrated. In this embodiment, the gap 5005 is formed like a combination of four quarter arcs. A numeral 5006 denotes a hole for venting gas. In general, when forming a metallic film on the sensitive PIQ, the gas generated on the interface makes the adherence of the conductor worse. Hence, it is preferable that a plurality of vent holes are formed for preventing the adherence from being lower. In this embodiment, it is essential to provide the removable portion 5005 of the second dielectric layer for connecting the second ground wiring section with the ground pad. This is for connecting the second ground wiring section with the ground pad.

As shown in FIG. 16 that is a plan view of the invention, according to the present embodiment, a main wiring surface of the semiconductor device 1 may be formed of such a two-layered conductor as being used in a printed board. Therefore, as compared with the structure that the signal wiring sections, the power wiring section and the ground wiring section are formed of the conductor on one level, the two-layered structure makes it possible to easily reduce the effective inductance more. Moreover, in this embodiment, the pad forming surface of the semiconductor device may be covered with the ground layer 5004 with no substantial gap. The embodiment thus provides the semiconductor device which is superior in lightproofness and does not suffer from malfunction caused by an infrared electromagnetic wave. Further, the wiring layer composes the power wiring section and the conductor of the bump forming portion composes the ground layer. These compositions make it possible to compose a path capacitor that is large in area, thus, capacitance. As mentioned above, since the path capacitor has no substantial capacitance, the path capacitor has an excellent frequency characteristic. It means that the semiconductor device provided with this path capacitor may be operated at a fast speed and low noises.

Figure 19:
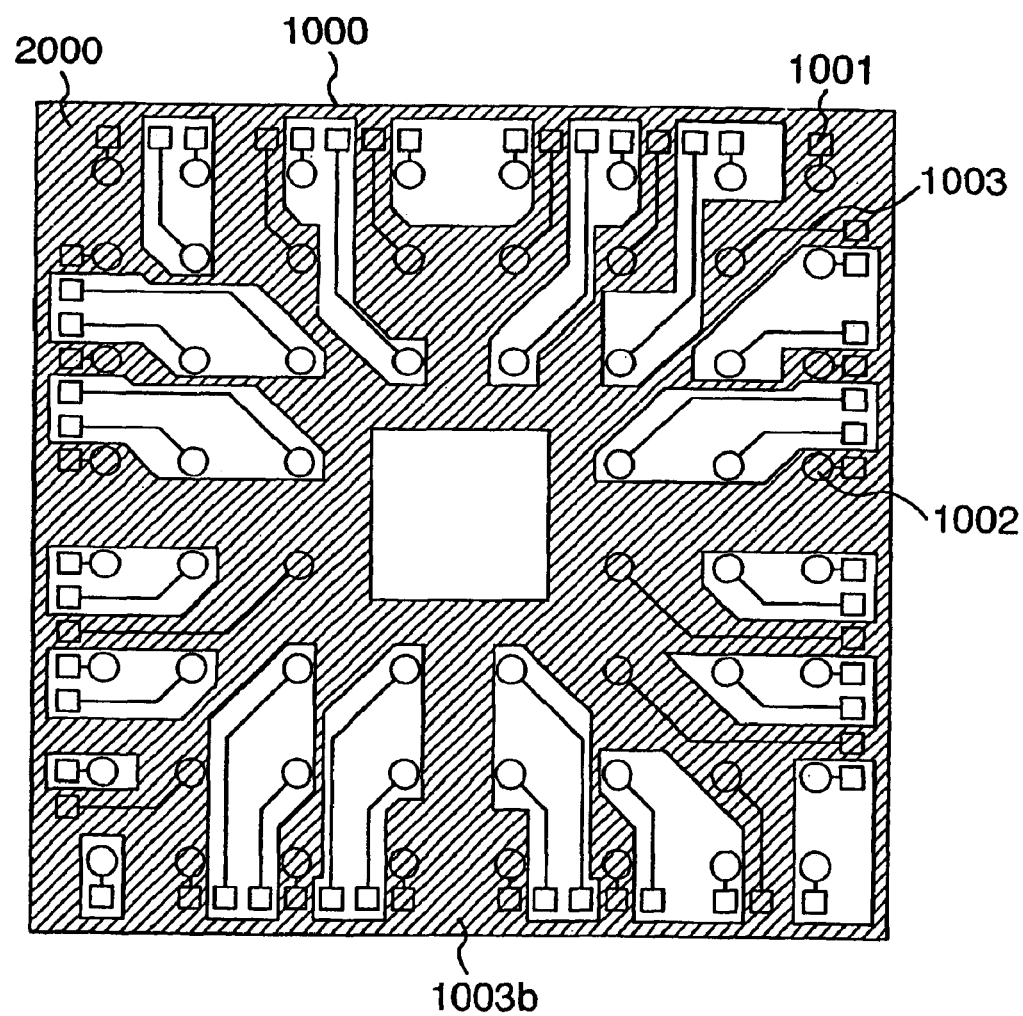
FIG. 19 is a plan view showing a wiring pattern of a semiconductor device according to another embodiment of the present invention.

FIG. 19 shows another embodiment of the present invention. This embodiment is an application of the present invention into the semiconductor device provided with the so-called peripheral pads as is often used in a microcomputer. By applying this invention, if the semiconductor device is provided with the peripheral pad, the reduction of the inductance of the wiring system and the fast operation of the device are made possible.

Preferred embodiment of the present invention makes it possible to reduce the effective inductance along the flow of the transient current caused when the semiconductor device is in operation. Hence, the present invention provides the semiconductor device that is less noisy and operable at a fast speed.

What is claimed is:

1. A semiconductor device comprising:
    a semiconductor element having external terminals located at a first level and external electrodes located at a second level higher than said first level;
    wherein said external terminals comprise:
        power terminals for supplying a power potential, ground terminals for supplying a ground potential and signal terminals for at least one of inputting and outputting a signal, all of which are formed on one main surface of the semiconductor element;
    wherein said external electrodes comprise:
        power electrodes being connected with said power terminals via power connecting sections;
    ground electrodes being connected with said ground terminals via ground connecting sections; and
    signal electrodes being connected with said signal terminals via signal connecting sections; and
    wherein one of said signal terminals, one of said signal electrodes and one of said signal connecting sections connecting with them are surrounded by said power connecting sections connecting said power terminals and said power electrodes or by said ground connecting sections connecting said ground terminals and said ground electrodes.

2. A semiconductor device comprising:
    a semiconductor element having signal pads to input and output a signal, power pads to supply a power potential, and ground pads to supply a ground potential, all of which are formed on one main surface of said semiconductor element; and
    bump electrodes which are respectively connected with said signal pads by signal connecting sections, with said power pads by power connecting sections, and with said ground pads by ground connecting sections,
    wherein one of said signal pads, one of said bump electrodes and one of said signal connecting sections connecting with them are surrounded by said power connecting sections connecting said power pads and said bump electrodes or by said ground connecting sections connecting said ground pads and said bump electrodes.

3. A semiconductor device comprising:
    a plurality of terminal electrodes comprised of a first level conducting layer each having a portion covered with a first level insulating layer and another portion exposed from said first level insulating layer;
    a second level conducting layer;
    a second level insulating layer formed over said second level conducting layer with a plurality of openings;
    a plurality of bump electrodes formed in said openings and projected from a top surface of said second level insulating layer;
    said bump electrodes being electrically connected with said terminal electrodes corresponding to said bump electrodes via said second level conducting layer;
    wherein ones of said bump electrodes used for signals are connected with said signal pads by signal connecting sections;
    wherein ones of said bump electrodes used for power are connected with said power pads by power connecting sections;
    wherein ones of said bump electrodes used for ground are connected with said ground pads by ground connecting sections, and
    wherein one of said signal pads, one of said bump electrodes used for signal and one of signal connecting sections connecting with them are surrounded by said power connecting sections connecting said power pads and said bump electrodes used for power or by said ground connecting sections connecting said ground pads and said bump electrodes used for ground.

4. A semiconductor device as claim 3, wherein some of said bump electrodes used for power supplying are electrically connected to each other via said second level conducting layer.

5. A semiconductor device as claim 3, wherein one of said power bump electrodes used for power is connected with at least one other bump electrode by one of said power connecting sections;
    one of said bump electrodes used for ground is connected with at least one other bump electrode on said main surface by one of said power connecting sections; and
    said signal pads are connected with said bump electrodes used for signal in a one-to-one manner by said signal connecting sections.

6. A semiconductor device as claim 5, wherein said power connecting sections or ground connecting sections are located adjacently at least part of said signal connecting sections.

7. A semiconductor device as claim 5, wherein said ground connecting sections and said signal connecting sections are located over several n-type layers formed on said main surface.

8. A semiconductor device as claim 5, wherein widths of said power connecting sections and ground connecting sections are wider than widths of said signal connection sections.

9. A semiconductor device as claim 5, wherein said power connecting sections or said ground connecting sections are located in a manner to cover an outer peripheral area of one main surface of said semiconductor element.

* * * * *